United States Patent
Takase et al.

(10) Patent No.: US 7,397,110 B2
(45) Date of Patent: Jul. 8, 2008

(54) HIGH RESISTANCE SILICON WAFER AND ITS MANUFACTURING METHOD

(75) Inventors: Nobumitsu Takase, Tokyo (JP); Hideshi Nishikawa, Tokyo (JP); Makoto Ito, Tokyo (JP); Koji Sueoka, Tokyo (JP); Shinsuke Sadamitsu, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 317 days.

(21) Appl. No.: 10/512,405

(22) PCT Filed: Apr. 16, 2003

(86) PCT No.: PCT/JP03/04866

§ 371 (c)(1),
(2), (4) Date: Jun. 15, 2005

(87) PCT Pub. No.: WO03/092065

PCT Pub. Date: Nov. 6, 2003

(65) Prior Publication Data

US 2005/0253221 A1    Nov. 17, 2005

(30) Foreign Application Priority Data

Apr. 26, 2002  (JP) ............................. 2002-127509
Dec. 12, 2002  (JP) ............................. 2002-360731

(51) Int. Cl.
*H01L 29/36* (2006.01)
*H01L 21/322* (2006.01)

(52) U.S. Cl. ............................. 257/611; 257/E29.109; 257/E21.318; 438/471; 117/2

(58) Field of Classification Search ............... 438/143, 438/402, 471, 799; 257/610, 611, 612, 655, 257/E29.068, E29.109, E21.318; 117/2, 117/3, 14
See application file for complete search history.

(56) References Cited

U.S. PATENT DOCUMENTS 5,502,331 A    3/1996   Inoue et al.

(Continued)

FOREIGN PATENT DOCUMENTS

EP    1087041    3/2001

(Continued)

*Primary Examiner*—Carl Whitehead, Jr.
*Assistant Examiner*—Jennifer M Dolan
(74) *Attorney, Agent, or Firm*—Morrison & Foerster LLP

(57) ABSTRACT

A high-resistance silicon wafer is manufactured in which a gettering ability, mechanical strength, and economical efficiency are excellent and an oxygen thermal donor is effectively prevented from being generated in a heat treatment for forming a circuit, which is implemented on the side of a device maker. A heat treatment for forming an oxygen precipitate nucleus is performed at 500 to 900° C. for 5 hours or more in a non-oxidizing atmosphere and a heat treatment for growing an oxygen precipitate is performed at 950 to 1050° C. for 10 hours or more on a high-oxygen and carbon-doped high-resistance silicon wafer in which resistivity is 100 Ωcm or more, an oxygen concentration is $14 \times 10^{17}$ atoms/cm$^3$ (ASTM F-121, 1979) or more and a carbon concentration is $0.5 \times 10^{16}$ atoms/cm$^3$ or more. By these heat treatments, a remaining oxygen concentration in the wafer is controlled to be $12 \times 10^{17}$ atoms/cm$^3$ (ASTM F-121, 1979) or less. Thus, there is provided a high-resistance, low-oxygen and high-strength silicon wafer in which resistivity is 100 Ωcm or more and an oxygen precipitate (BMD) having a size of 0.2 μm is formed so as to have high density of $1 \times 10^4$/cm$^2$ or more.

15 Claims, 6 Drawing Sheets

U.S. PATENT DOCUMENTS

| | | | |
|---|---|---|---|
| 6,544,656 B1 * | 4/2003 | Abe et al. | 428/446 |
| 2003/0054641 A1 * | 3/2003 | Binns et al. | 438/689 |
| 2003/0068890 A1 * | 4/2003 | Park | 438/689 |

FOREIGN PATENT DOCUMENTS

| | | |
|---|---|---|
| JP | 04-069937 | 3/1992 |
| JP | 10150048 | 6/1998 |
| JP | 10150048 A * | 6/1998 |
| JP | 2001-217251 | 8/2001 |
| JP | 2001217251 A * | 8/2001 |
| WO | WO-02/25717 | 3/2002 |

* cited by examiner

HIGH RESISTANCE SILICON WAFER AND ITS MANUFACTURING METHOD

TECHNICAL FIELD

The present invention relates to a high-resistance silicon wafer used in a support substrate and the like in a high-frequency communication device and its manufacturing method.

BACKGROUND ART

Recently, a demand for high-resistance substrate is increased along with the widespread use of a high-frequency communication device used in a short-distance wireless LAN. Conventionally, a compound semiconductor such as GaAs has been mainly used for a support substrate of a RF (Radio Frequency high frequency) which requires high resistance. However, the compound semiconductor substrate is very expensive.

Meanwhile, a silicon CMOS requires a large amount of power, so that it has been considered that it is not suitable for the RF circuit. However, because of recent considerable miniaturization and development of designing, it can be applied to the RD circuit. Therefore, a high-resistance silicon wafer which is excellent in RF characteristics and excellent in economical efficiency such as a mirror-surface silicon wafer or a SOI (Silicon On Insulator) wafer using high-resistance crystal grown by the Czochralski method (hereinafter referred to as the CZ method) has attracted a lot of attention instead of the substrate of the compound semiconductor such as GaAs.

However, since a quartz crucible is used when a silicon single crystal is manufactured by the CZ method, oxygen is contained in the crystal in an oversaturated state. Since a thermal donor is formed by this oxygen in a heat treatment in the process of forming the circuit of the device, there is a big problem such that resistivity of the wafer unstably varies on the side of a device maker.

FIG. 1 is a graph showing a relation between the thermal donor and the wafer resistivity. In a case of the normal low-resistance wafer to which a dopant is added, since the thermal donor slightly affects the resistivity of the wafer, there is no problem in a real operation. However, in a case of the high-resistance wafer in which the dopant is limited, when it is an n type, the resistivity is considerably reduced as the thermal donor is increased. When it is a p type, although the resistivity is considerably increased along with the increase of the thermal donor at first, if the thermal donor is kept increasing, the p type is converted to the n type, so that the resistivity is considerably decreased.

In order to solve the above problem such that the resistivity considerably varies along with the increase of the thermal donor, there is taken measures to prevent the thermal donor from being formed by using a low-oxygen silicon wafer which is manufactured using a special crucible in which oxygen is prevented from being fused by a MCZ method or an inner face SiC coating. However, the low-oxygen silicon wafer which needs to use the MCZ method or the special crucible is surely expensive as compared with the general-purpose silicon wafer having a relatively high oxygen concentration which is manufactured by the normal CZ method. In addition, oxygen lowering has a technical limitation. That is, in general, it is considered that concentration of $6 \times 10^{17}$ atoms/cm$^3$ is difficult and a degree of $8 \times 10^{17}$ atoms/cm$^3$ or less is a limit in a wafer of 300 mm. In addition, in the silicon wafer having a low oxygen concentration, there is a problem of slipping and the like because of the lowering of mechanical strength caused by reduction in oxygen concentration.

In order to solve the above problem, International Publication WO 00/55397 pamphlet discloses technique in which a silicon single crystal rod having resistivity of 100 Ωcm or more and initial interstitial oxygen concentration of 10 to 25 ppma [JEIDA] (7.9 to $19.8 \times 10^{17}$ atoms/cm$^3$ [Old-ASTM]) is grown, and a heat treatment for oxygen precipitation is performed on a silicon wafer cut from the above single crystal rod so as to limit the remaining interstitial oxygen concentration in the wafer to 8 ppma [JEIDA] ($6.4 \times 10^{17}$ atoms/cm$^3$ [Old-ASTM]) or less.

According to this technique, the manufacturing cost of the initial wafer becomes low because the general-purpose silicon wafer having high initial oxygen concentration is used. Although the general-purpose silicon wafer having high initial oxygen concentration is used, since the oxygen precipitating heat treatment is performed on the silicon wafer, the remaining oxygen concentration is lowered. Therefore, an oxygen donor is effectively prevented from being generated in a heat treatment for forming a circuit which is performed on the side of a device maker. In the process of lowering the oxygen concentration in the wafer, a large amount of oxygen precipitate (BMD) is generated. Therefore, a gettering ability of the wafer is improved.

However, according to the technique disclosed in the above pamphlet, it is necessary to generate a large amount of oxygen precipitate (BMD) using a high-resistance primary substrate having high-oxygen concentration, and to sufficiently lower the remaining oxygen concentration of a product silicon wafer by generating the large amount of oxygen precipitate (BMD) However, this causes the following problems.

First, to lower the remaining oxygen concentration in the product silicon wafer causes the mechanical strength of the wafer to be lowered. This is clear from the fact that slip dislocation generated from a wafer supporting part in the heat treatment is fixed by oxygen and as a result, a slip length is lowered as the oxygen concentration is increased [M. Akatsuka et al., Jpn. J. Appl. Phys., 36 (1997) L1422]. Meanwhile, the oxygen precipitate (BMD) is a factor of affecting the strength. The influence of BMD to the strength is complicated. For example, when the heat and stress of one's own weight added to the wafer is not so large, the movement of the slip dislocation is prevented and the strength is improved (patent document 1), but when the heat and the stress of one's own weight is large, the BMD itself becomes a source of the slip dislocation, so that the strength is lowered and the wafer is probably warped (K. Sueoka et al., Jpn. J. Appl. Phys., 36 (1997) 7095). The heat and the stress of one's weight applied to the wafer in the real device process depend on a device structure or a thermal sequence, and it is expected to be increased in some cases.

The second problem is resistance variation along with hydrogen annealing or argon annealing for removing COP [Crystal Originated Particle: aggregation of holes and a void defect surrounded by (111) surface]. In general, when an oxidation heat treatment is performed on a CZ silicon wafer, a ring-shaped oxidation-induced stacking fault called OSF is generated at a part in the crystal diameter direction. It is known that the position where the ring is generated depends on a crystal pulling speed and properties are different between the outer side and the inner side of the ring.

FIG. 2 is a lateral sectional view showing a general distribution of crystal defects in the diameter direction, and FIG. 3 is a vertical sectional view showing positional variation of the crystal defect distribution when the crystal pulling speed is varied. According to the normally grown CZ silicon wafer, a no-defect region exists on the inner side of the ring-shaped OSF developing region and its inside becomes a CCP developing region. Meanwhile, an oxygen precipitation accelerating region and an oxygen precipitation suppressing region exist on the outer side of the ring-shaped OSF developing region and its outside is a dislocation cluster defect developing region. Since the COP and dislocation cluster defect are introduced in the crystal in the crystal growing process, they are called grown-in defect also. Thus, a region from the no-defect region on the inner side of the ring-shaped OSF developing region to the oxygen precipitation suppressing region on the inner side of the dislocation cluster defect developing region is a perfect no-defect region in which the COP or dislocation cluster does not exist.

Here, the ring-shaped OSF developing region shifts toward the center of the crystal as the pulling speed is lowered and finally it disappears in the center. At this time, the vertical sectional configuration of the OSF developing region becomes V shape or U shape which curves downward in the convex direction. Therefore, it is difficult to manufacture the crystal having perfectly no defect on the whole region in the diameter direction with high yield. Thus, in view of productivity also in the real operation, the growing conditions are selected such that the OSF developing region may be positioned at an periphery of the wafer outside of the device forming region in many cases. As a result, since there are many harmful COP on the whole surface of the wafer and on such wafer, it is normal to perform argon annealing or hydrogen annealing in order to eliminate the COP from the surface of the wafer which is used as a device region.

However, since the argon annealing and the hydrogen annealing are basically technique for performing heat treatments on the wafer at high temperature for a long time in a reducing atmosphere (argon has a reducing property at high temperature), the wafer could be contaminated with heavy metal impurities from a heat treatment furnace. When the high-resistance wafer is contaminated with heavy metal impurities, the resistivity of the wafer extremely varies even with a little contamination. Therefore, the argon annealing and the hydrogen annealing are not desirable.

In addition, according to the hydrogen annealing, the dopant on the surface of the wafer is diffused outward by hydrogen reduction, so that the resistivity on the wafer surface tends to be increased. As a result, it is difficult to manufacture a high-resistance wafer having a predetermined resistivity range, with high precision. Meanwhile, according to the argon annealing, since the reducing action is not so strong as in the hydrogen annealing, there is no problem such that the dopant on the wafer surface outwardly diffuses and the resistivity of the wafer surface becomes high. However, a natural oxidation film on the wafer surface is removed in the heat treatment and dopant impurities contained in the removed natural oxidation film are diffused in the wafer, so that the resistivity of the wafer surface tends to being lowered.

Thus, when the high-resistance wafer is manufactured, the argon annealing and the hydrogen annealing for eliminating the COP are undesirable technique.

It is an object of the present invention to provide a high-resistance silicon wafer in which a gettering ability is excellent, an oxygen thermal donor is prevented from being generated in a heat treatment for forming a circuit which is implemented on the side of a device maker and mechanical strength is high, and its manufacturing method.

It is another object of the present invention to provide a high-resistance silicon wafer in which a gettering ability is excellent, an oxygen thermal donor is prevented from being generated in a heat treatment for forming a circuit which is implemented on the side of a device maker and resistance variation caused by argon annealing or hydrogen annealing for eliminating COP can be avoided, and its manufacturing method.

DISCLOSURE OF THE INVENTION

In order to attain the above objects, the inventors of the present invention determined that general-purpose high-oxygen silicon wafer was indispensable as a primary substrate, and studied a method of preventing generation of oxygen thermal donor which became a problem in the high-oxygen silicon wafer. As a result, it was found that a size of each oxygen precipitate (BMD) was important as well as a total amount of oxygen precipitate (BMD), that is, precipitation density of the oxygen precipitate (BMD).

In addition, they reached the conclusion that carbon doping was effective against reduction in strength which became a problem when a sufficiently large amount of oxygen precipitate (BMD) were precipitated, and use of the crystal free from the COP in which the COP was removed at the crystal growing stage was effective against resistivity variation caused by argon annealing or hydrogen annealing for removing the COP. When carbon is added, the formation of the oxygen precipitate (BMD) can be promoted and the oxygen concentration in the primary substrate can be reduced.

A first high-resistance silicon wafer according to the present invention is a high-resistance silicon wafer having resistivity of 100 Ωcm or more, in which oxygen precipitate (BMD) having a size of 0.2 μm or more is formed so as to have density of $1 \times 10^4/cm^2$ or more in the wafer, an oxygen concentration in the wafer is $12 \times 10^{17}$ atoms/cm$^3$ (ASTM F-121, 1979) or less, and a carbon concentration is $0.5 \times 10$ atoms/cm$^3$ or more.

A second high-resistance silicon wafer according to the present invention is a high-resistance silicon wafer having resistivity of 100 Ωcm or more, in which a density of a grown-in defect detected by seco etching is $1 \times 10^3/cm^{-3}$ or less, an oxygen precipitate (BMD) having a size of 0.2 μm or more is formed so as to have density of $1 \times 10^4/cm^2$ or more in the wafer and an oxygen concentration in the wafer is $12 \times 10^{17}$ atoms/cm$^{-3}$ (ASTM F-121, 1979) or less.

In either high-resistance silicon wafer, since the oxygen precipitate (BMD) having a size of 0.2 μm or more is formed so as to have density of $1 \times 10^4$ cm$^2$ or more, its gettering ability is excellent. In addition, since the general-purpose high-oxygen silicon wafer can be used as the primary substrate, its manufacturing cost can be lowered. Since the oxygen concentration in the wafer is limited to $12 \times 10^{17}$ atoms/cm$^3$ (ASTM F-121, 1979) or less, the oxygen thermal donor is prevented from being generated in a heat treatment for forming a circuit which is implemented on the side of the device maker.

Even if the density of the oxygen precipitate (BMD) existing in the wafer is as high as $1 \times 10^4/cm^2$ or more, when the size is less than 0.2 μm, a desired effect cannot be provided. The present invention is significant in that the large-sized oxygen precipitate (BMD) of 0.2 μm or more is focused on and the large-sized oxygen precipitate is formed so as to have high density of $1 \times 10^4/cm^2$ or more. When the density of the large-sized oxygen precipitate is less than $1 \times 10^4/cm^2$, the desired effect cannot be provided. Especially preferable density is $1 \times 10^5/cm^2$ or more. When the density is too high, the wafer becomes deformed because of apparent lowering of the mechanical strength, so that a degree of flatness is lowered. In this respect, it is preferably $1 \times 10^7/cm^2$ or less.

When the remaining oxygen concentration in the wafer is more than $12\times10^{17}$ atoms/cm$^3$ (ASTM F-121, 1979), the oxygen thermal donor cannot be sufficiently prevented from being generated in the heat treatment for forming the circuit, which is implemented on the device manufacturer side. Strictly speaking, the effective oxygen concentration shifts depending on the resistivity of the wafer. When the resistivity is not less than 100 Ωcm and less than 300 Ωcm, the oxygen concentration may be $12\times10^{17}$ atoms/cm$^3$ or less, when the resistivity is not less than 300 Ωcm and less than 2000 Ωcm, the oxygen concentration is preferably $7\times10^{17}$ atoms/cm$^3$ or less, and when the resistivity is not less than 2000 Ωcm, the oxygen concentration is preferably $5.8\times10^{17}$ atoms/cm$^3$ or less. According to a lower limit of the oxygen concentration, to extremely lower the remaining oxygen concentration is difficult in technology and causes the oxygen precipitate (BMD) to be increased. This increase causes the wafer to be deformed as described above. Therefore, it is preferably $4\times10^{17}$ atoms/cm$^3$ or more.

In addition, according to the first high-resistance silicon wafer of the present invention, since the carbon concentration in the wafer is controlled so as to be $0.5\times10^{16}$ atoms/cm$^3$ or more, the lowering of the waver strength because of the large amount of formation of the oxygen precipitate (BMD) can be prevented. In addition, there is an effect such that when carbon is added, the formation of the oxygen precipitate (BMD) can be promoted. Especially preferable carbon concentration is $1\times10^{16}$ atoms/cm$^3$ or more. Although carbon concentration can be increased to be $4\times10^{17}$ atoms/cm$^3$ which is solid solubility of carbon in silicon, when it is too much, it promotes dislocation when the crystal is grown. Therefore, in the real operation, it is preferably $1\times10^{17}$ atoms/cm$^3$ or less.

Meanwhile, according to the second high-resistance silicon wafer of the present invention, since the crystal free from the COP in which the density of the grown-in defect detected by the seco etching is limited to be $1\times10^3$/cm$^{-3}$ or less is used, the argon annealing or the hydrogen annealing for eliminating the COP is not necessary, so that resistivity variation caused by the annealing can be avoided.

In addition, according to a manufacturing method of the first high-resistance silicon wafer of the present invention, a primary silicon wafer in which resistivity is 100 Ωcm or more, an oxygen concentration is $12\times10^{17}$ atoms/cm$^3$ (ASTM F-121, 1979) or more, and a carbon concentration is $0.5\times10^{16}$ atoms/cm$^3$ or more is used and a remaining oxygen concentration in the wafer is controlled to be $12\times10^{17}$ atoms/cm$^3$ (ASTM F-121, 1979) or less by performing a heat treatment for forming an oxygen precipitate nucleus and a heat treatment for growing an oxygen precipitate on the primary silicon wafer.

According to a manufacturing method of the second high-resistance silicon wafer of the present invention, a primary silicon wafer in which resistivity is 100 Ωcm or more, an oxygen concentration is $14\times10^{17}$ atoms/cm$^3$ (ASTM F-121, 1979) or more, and a density of a grown-in defect detected by seco etching is $1\times10^3$/cm$^{-3}$ or less is used, and a remaining oxygen concentration in the wafer is controlled to be $12\times10^{17}$ atoms/cm$^3$ (ASTM F-121, 1979) or less by performing a heat treatment for forming an oxygen precipitate nucleus and a heat treatment for growing an oxygen precipitate on the primary silicon wafer.

According to the manufacturing method of the high-resistance silicon wafer of the present invention, since the high-oxygen and high-resistance silicon wafer having the oxygen concentration of $14\times10^{17}$ atoms/cm$^3$ (ASTM F-121, 1979) or more, and $12\times10^{17}$ atoms/cm$^3$ (ASTM F-121, 1979) or more in the case of carbon doping is used as the primary substrate, its manufacturing cost can be lowered. In addition to the fact that the primary oxygen concentration is high, since the remaining oxygen concentration after the heat treatment is as low as $12\times10^{17}$ atoms/cm$^3$ (ASTM F-121, 1979) or less, and two-stage heat treatments of the heat treatment for forming the oxygen precipitate nucleus and the heat treatment for forming the oxygen precipitate are implemented, a large-sized oxygen precipitates (BMD) can be formed so as to have high density. More specifically, the oxygen precipitates (BMD) having a size of 0.2 μm or more can be formed at high density of $1\times10^4$/cm$^2$ or more. Thus, the high-resistance silicon wafer having excellent gettering ability can be manufactured. Thus, since the remaining oxygen concentration is limited to $12\times10^{17}$ atoms/cm$^3$ (ASTM F-121, 1979) or less, the oxygen thermal donor can be prevented from being generated in the heat treatment for forming the circuit performed by the device maker.

The oxygen precipitate (BMD) and especially the oxygen precipitate (BMD) existing on the wafer surface become a harmful defect in the process of forming the device and cause the device characteristics to deteriorate. In this problem, it is effective that an oxygen outward diffusion heat treatment is performed before the oxygen precipitate (BMD) is precipitated, to prevent the growth of the oxygen precipitate (BMD) and a DZ (Denuded Zone) layer is formed on the wafer surface. In addition, when the crystal free from the COP is not used, in view of improvement of the device characteristics, it is important to remove the grown-in defect such as the COP and the dislocation cluster generated in the crystal growing process from the wafer surface and regarding this, atmosphere selection in the oxygen outward diffusion heat treatment is effective.

The carbon doping to the primary substrate has a function of promoting the formation of the oxygen precipitate (BMD). When the carbon doping is performed for this purpose, even when the lower limit of the oxygen concentration in the primary substrate is lowered to $12\times10^{17}$ atoms/cm$^3$, the total amount of oxygen precipitate (BMD) can be sufficiently provided. Especially preferable carbon concentration is $1\times10^{16}$ atoms/cm$^3$ or more. Although the carbon concentration can be increased to be $4\times10^{17}$ atoms/cm$^3$ which is solid solubility of carbon in silicon, when it is too much, it promotes dislocation when the crystal is grown. Therefore, in the real operation, it is preferably $1\times10^{17}$ atoms/cm$^3$ or less.

In the case the oxygen precipitate (BMD) becomes a defect part in the device forming process, it is preferably to form a DZ (Denuded Zone: no defect) at least 5 μm or more in depth from the wafer surface. The DZ layer here is provided such that after a heat treatment at 1000° C. for 16 hours in a dry oxygen atmosphere, the wafer is cleaved and its cleaved surface is etched away 2 μm by a selective etching solution [HF:HNO$_3$:CrO$_3$:Cu(NO$_3$)$_2$:H$_2$O:CH$_3$COOH=1200 cc:600 cc:250 g:40 g:1700 cc:1200 cc] and the DZ layer is defined as a distance from the wafer surface until a first etch pit in the wafer depth direction observed by an optical microscope.

As a method of forming the DZ layer on the wafer surface, the oxygen outward diffusion heat treatment is preferably performed on the wafer at 1100 to 1250° C. for 1 to 5 hours before the heat treatment for forming the oxygen precipitate nucleus. By this oxygen outward diffusion heat treatment, oxygen on the wafer surface is decreased and the oxygen precipitate (BMD) is prevented from growing, whereby the DZ layer is formed.

The oxygen outward diffusion heat treatment can be performed in an atmosphere containing nitrogen gas. In addition, it may be performed in a hydrogen gas atmosphere, argon gas atmosphere or these mixed gas atmosphere. In the case of the p-type wafer, for example, when the heat treatment is performed in the hydrogen gas, boron on the wafer surface is diffused outward and the concentration is lowered, whereby resistance can be increased. In addition, the grown-in defect called the COP which is formed in the crystal growing process becomes a solution and it is reduced in size and finally eliminated on the wafer surface, whereby the wafer quality can be improved together with absence of the oxygen precipitate (BMD). Meanwhile, when it is performed in the argon gas atmosphere, the grown-in defect is eliminated similar to the case of the hydrogen gas atmosphere. Meanwhile, boron is diffused inward from the outside depending on the atmosphere of the heat treatment, so that there is a concern that the concentration is increased and the resistivity is decreased on the wafer surface. When the crystal free from the COP is used, the hydrogen annealing or argon annealing is not necessary as described above. That is, when the crystal free from the COP is used, the oxygen outward diffusion heat treatment is preferably performed in the atmosphere containing the nitrogen gas.

According to the oxygen outward diffusion heat treatment, a RTA (Rapid Thermal Anneal) process may be performed instead of the above described heat treatment at high temperature for a long time. According to the RTA process called lamp anneal also, the oxygen on the wafer surface can be diffused outward for a very short time. In addition, when the RTA process is performed at high temperature in the atmosphere containing the argon gas, since excessive holes are sufficiently injected into the wafer, there is an effect that the formation of the oxygen precipitate nucleus into the wafer can be promoted in the subsequent heat treatment for forming the oxygen precipitate nucleus. In addition, when the initial oxygen concentration of the wafer to be used is very high, since the oxygen precipitate nucleus can be formed toward the inside of the wafer only by the RTA process, the subsequent heat treatment for forming the oxygen precipitate nucleus at low temperature can be omitted. In addition, as will be described below, the RTA process is especially effective when the crystal free from the COP is used.

That is, there is a wafer in which a region in which the holes are predominant and a region in which interstitial silicon is predominant are mixed (the wafer in which the OSF ring is generated on the surface, for example) among the crystal free from the COP. When the wafer in which such crystal regions are mixed is used, the precipitation density of the BMD varies in the wafer diameter direction and the uniform gettering ability is not provided on the surface. Thus, when the RTA process is performed at high temperature, since the holes are sufficiently injected from the wafer surface, the hole concentration becomes uniform in the diameter direction and the BMD precipitation amount in the diameter direction can be uniform. In addition, since there is an elimination effect of the small oxygen precipitate nucleus because of the rapid thermal annealing, the size of the oxygen precipitate formed subsequently can be uniform. Thus, the DZ layer can be surely provided on the wafer surface by an oxygen outward diffusion effect by the high-temperature RTA process.

In addition, a crystal free from the COP, consisting of the same crystal region on the whole surface of the wafer (the wafer only comprising the oxygen precipitation accelerating region in which the OSF ring is closed, for example) is used, the BMD in the wafer diameter direction can be made uniform by performing the oxygen outward diffusion heat treatment (in the atmosphere containing argon gas) without using the RTA process.

That is, when the crystal free from the COP is the mixed type of crystal regions, the RTA process is suitable as the oxygen outward diffusion heat treatment, and when it is the same type of crystal region, both RTA process and the normal oxygen outward diffusion heat treatment (in the atmosphere containing the nitrogen gas) are suitable.

The conditions of the RTA process are preferably at 1150 to 1300° C. for 1 to 60 seconds because when the temperature is lower than 1150° C., the DZ film is not sufficiently provided in thickness in the wafer surface and also the sufficient holes are not injected into the wafer and there is not provided the effect such that the formation of the oxygen precipitate nucleus is promoted. Meanwhile, when the temperature is more than 1300° C., slip dislocation is generated in the heat treatment, so that the device characteristics deteriorates. According to the heat treatment time, the DZ layer is sufficiently provided and the holes necessary for forming the oxygen precipitate nucleus can be sufficiently injected in the heating time of 60 seconds or less in the above temperature range. The heat treatment atmosphere is basically the nitrogen atmosphere in which the holes are sufficiently injected and a little oxygen gas or inert gas (Ar gas and the like) may be mixed in the nitrogen gas or ammonia gas.

As the heat treatment for forming the oxygen precipitation nucleus, a low-temperature heat treatment at 500 to 900° C. for 5 hours or more is preferable, and the atmospheric gas may be nitrogen, oxygen, hydrogen, argon or mixed of these. When the heat treatment temperature is less than 500° C., although the oversaturated degree of oxygen is high, a diffusion speed of oxygen is low and it takes time to form the oxidation precipitate nucleus, which is not preferable in view of industrial productivity. When the temperature is more than 900° C., although the diffusion speed becomes high, the oversaturated degree becomes low and it is difficult to implement a sufficient oxygen precipitate density. In addition, the heat treatment time is related with the heat treatment temperature and substrate oxygen, even if the oxygen concentration is as very high as $17 \times 10^{17}$ atoms/cm$^3$ or more, it is difficult to implement the sufficient oxygen precipitate nucleus density when the time is less than 5 hours. Especially preferable temperature in the heat treatment for forming the oxygen precipitate nucleus is 700 to 900° C. This is because the inventors of the present invention discovered that even when the thermal donor elimination heat treatment was performed at 650° C. for 30 minutes, when it stayed in the temperature range of around 650° C. again for a long time, a new donor was generated to vary the resistivity. The new donor was apparent in the wafer because its resistivity is 500 Ωcm or more. Therefore, the heat treatment for forming the oxygen precipitate nucleus at 700 to 900° C. is especially effective for the wafer having resistivity of 500 Ωcm or more.

As the heat treatment for growing the oxygen precipitate following the heat treatment for forming the oxygen precipitate nucleus is preferably a middle-temperature heat treatment performed at 950 to 1050° C. for 10 hours or more. When the heat treatment temperature is less than 950° C., a difference between the size of the oxygen precipitate nucleus formed in the heat treatment for forming the oxygen precipitate nucleus performed at 500 to 900° C. and the size of the nucleus grown at the temperature less than 950° C. is small and it is difficult to reduce the substrate oxygen concentration and to grow as the oxygen precipitate having the size required for gettering. When the temperature is more than 1050° C., a difference between the size of the oxygen precipitate nucleus formed in the heat treatment for forming the oxygen precipitate nucleus performed at 500 to 900° C. and the size of the nucleus grown at the temperature less than 950° C. is large, so that the formed oxygen precipitate nucleus disappears and the density is lowered. When the heat treatment time is less than 10 hours, it is difficult to grow the oxygen precipitate having the size required for reducing the substrate oxygen concentration and gettering.

BEST MODE FOR CARRYING OUT THE INVENTION

Figure 4:
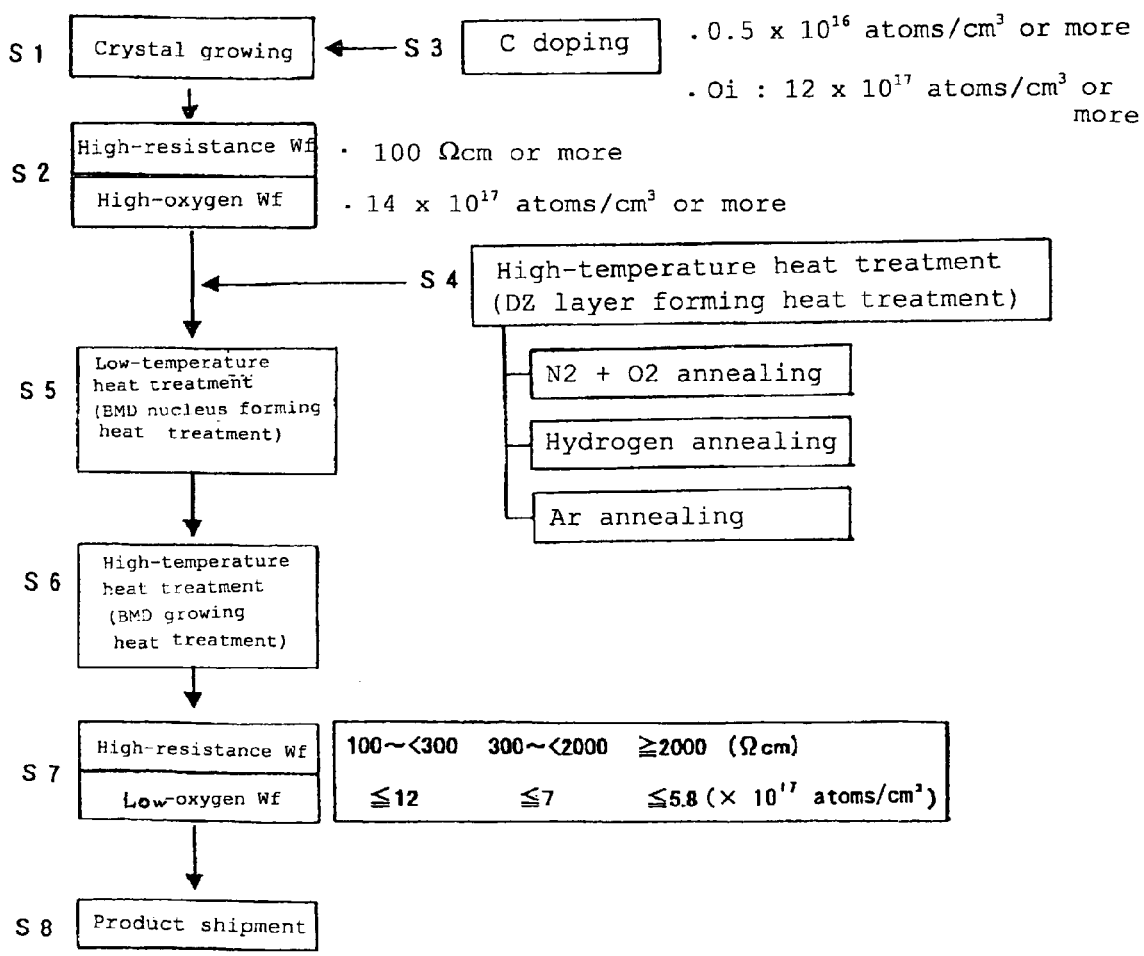
FIG. 4 is a flow showing processing procedures according to an embodiment of the present invention.
Figure 5:
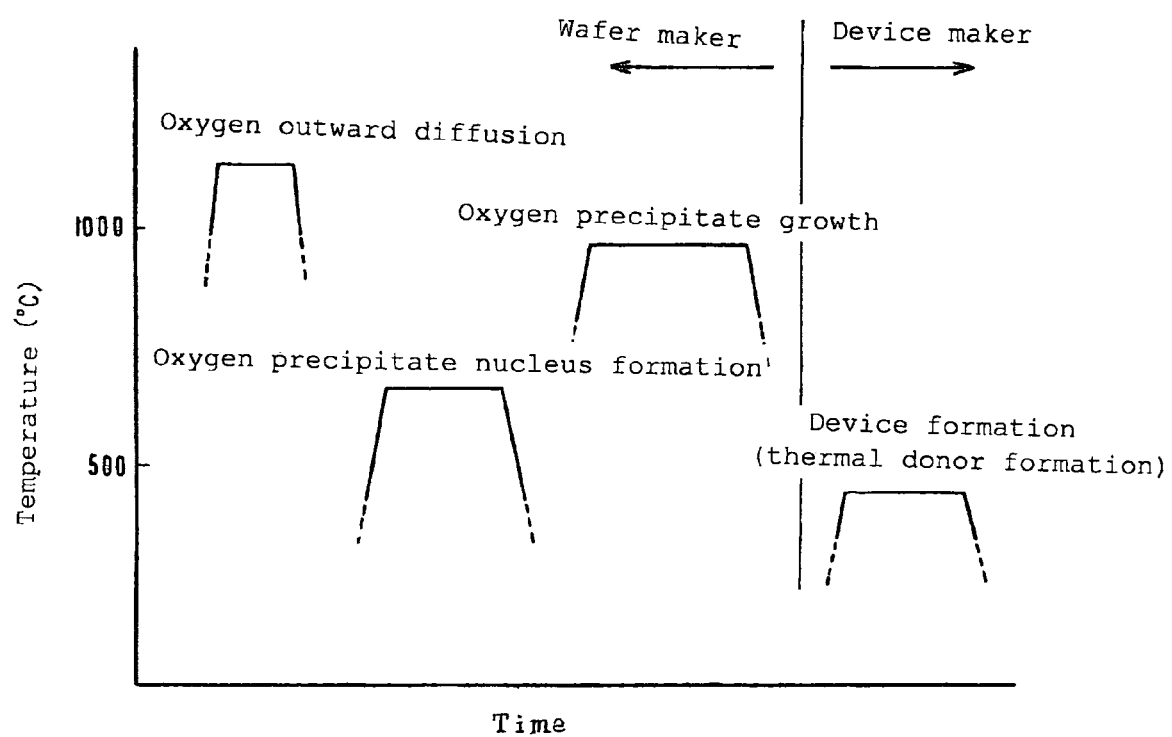
FIG. 5 is a graph showing a heat pattern of a heat treatment according to the same embodiment.

Hereinafter, embodiments of the present invention are described with reference to FIG. 4 (a flow showing a process procedure in the embodiments of the present invention) and FIG. 5 (a graph showing a heat pattern of a heat treatment in the embodiments of the present invention).

First Embodiment

According to this embodiment, a high-oxygen, high-resistance and carbon-doped silicon single crystal is formed by a normal CZ method and a primary substrate is formed from the silicon single crystal such that an OSF ring exists at a periphery, a COP exists inside, an oxygen concentration is $12 \times 10^{17}$ atoms/cm$^3$ (ASTM F-121, 1979) or more, a carbon concentration is $0.5 \times 10^{16}$ atoms/cm$^3$ or more, and resistance is as high as 100 Ω or more at steps S1 to S3.

If needed, an oxygen outward diffusion heat treatment is performed on the primary substrate at 1100 to 1250° C. for 1 to 5 hours at step S4. By this oxygen outward diffusion heat treatment, an oxygen precipitate (BMD) is prevented from being generated in the heat treatment to be described below. Thus, a DZ (Denuded Zone) layer is formed at least 5 μm in depth from a surface of a product wafer.

The oxygen outward diffusion heat treatment can be performed in an atmosphere of mixed gas of nitrogen gas and oxygen gas as described above. In addition, it can be performed in a hydrogen gas atmosphere. In addition, it can be performed in an atmosphere of mixed gas of hydrogen gas and argon gas.

Then, as a heat treatment for forming a nucleus of the oxygen precipitate, a low-temperature heat treatment is performed on the primary substrate at 500 to 900° C. and preferably 700° C. or more for 5 hours or more at step S5. Then, as a heating treatment for growing the oxygen precipitate, a middle-temperature heat treatment is performed at 950 to 1050° C. for 10 hours or more at step S6.

By these heat treatments, the oxygen precipitate (BMD) having a size of 0.2 μm or more is formed at a density of $1 \times 10^7$/cm$^2$ or more in a silicon wafer having high resistance of 100 μm or more, and an oxidation concentration in the wafer is reduced to $12 \times 10^{17}$ atoms/cm$^3$ (ASTM F-121, 1979) or more at step S7.

As concrete values, the oxygen concentration (ASTM F-121, 1979) in the wafer is $12 \times 10^{17}$ atoms/cm$^3$ or less when resistivity of the wafer is not less than 100 Ωcm and less than 300 Ωcm, $7 \times 10^{17}$ atoms/cm$^3$ or less when the resistivity is not less than 300 Ωcm and less than 2000 Ωcm, and $5.8 \times 10^{17}$ atoms/cm$^3$ or less when the resistivity is not less than 2000 Ωcm in order to effectively prevent a thermal donor.

The silicon wafer product as thus manufactured is shipped to a device maker at step S8. The characteristics of the product are described below.

First, since a general-purpose silicon wafer having a relatively high oxygen concentration is used as the primary substrate, it is economically efficient. Secondly, since a large-sized oxygen precipitate (BMD) is formed so as to have high density, it has an excellent gettering ability. Thirdly, a final oxygen concentration is low and the oxygen thermal donor is prevented from generating in a heat treatment for forming a circuit which is implemented by the device maker. Fourthly, since carbon is doped at a stage of forming a crystal, mechanical strength is high. Fifthly, when the oxygen outward diffusion heat treatment is performed on the primary substrate, the DZ (Denuded Zone) layer is formed on a surface of the product, so that its device characteristics are especially excellent. Sixthly, when hydrogen gas or argon gas is selected as an atmosphere in the oxygen outward diffusion heat treatment, a grown-in defect can be reduced or vanished and a density of a LPD (Light Point Defect) having a size of 0.12 μm or more observed on the wafer surface can be reduced to 0.2/cm$^2$ or less.

Second Embodiment

Figure 1:
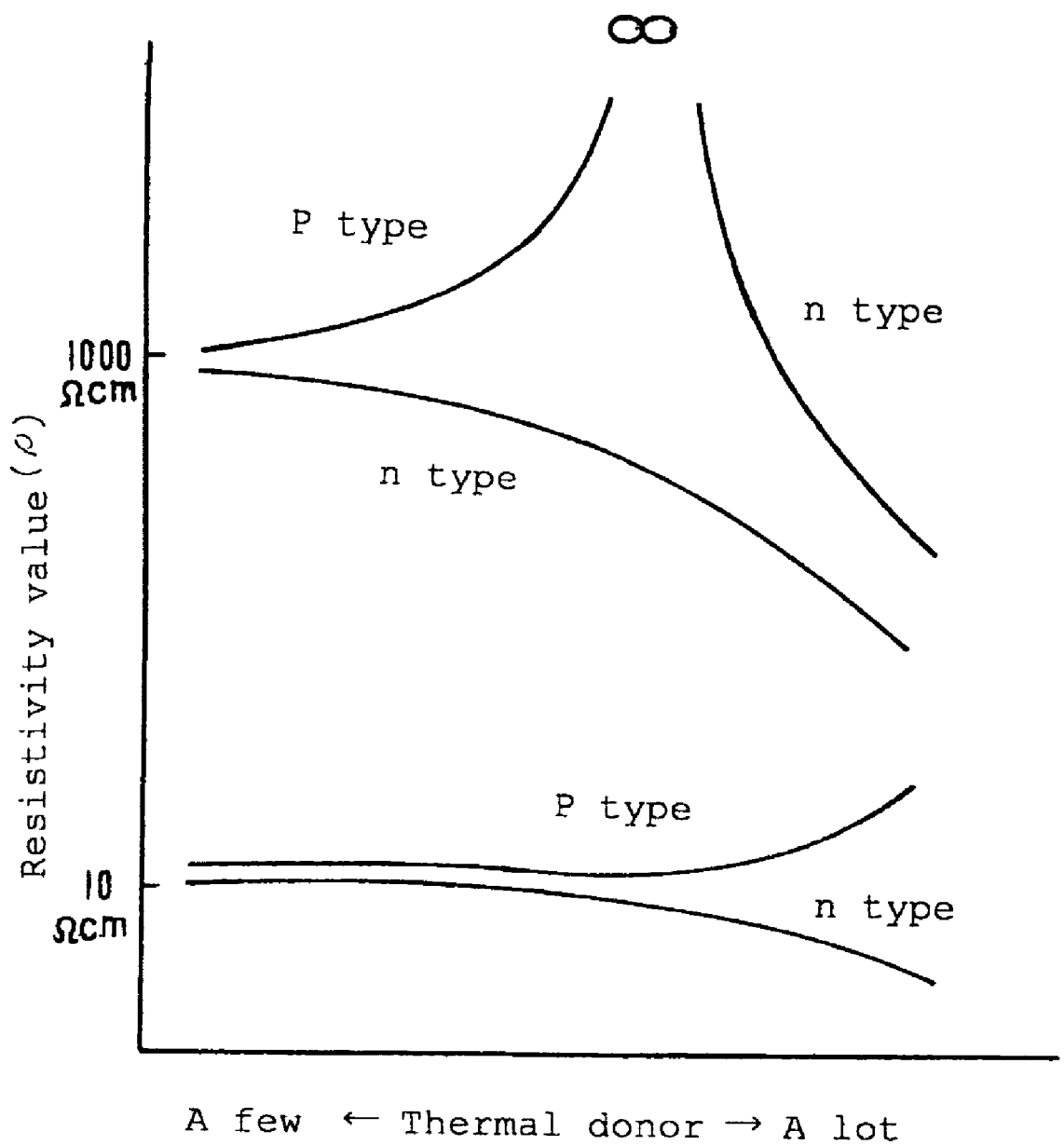
FIG. 1 is a graph showing an influence of a thermal donor on resistivity of a wafer.
Figure 2:
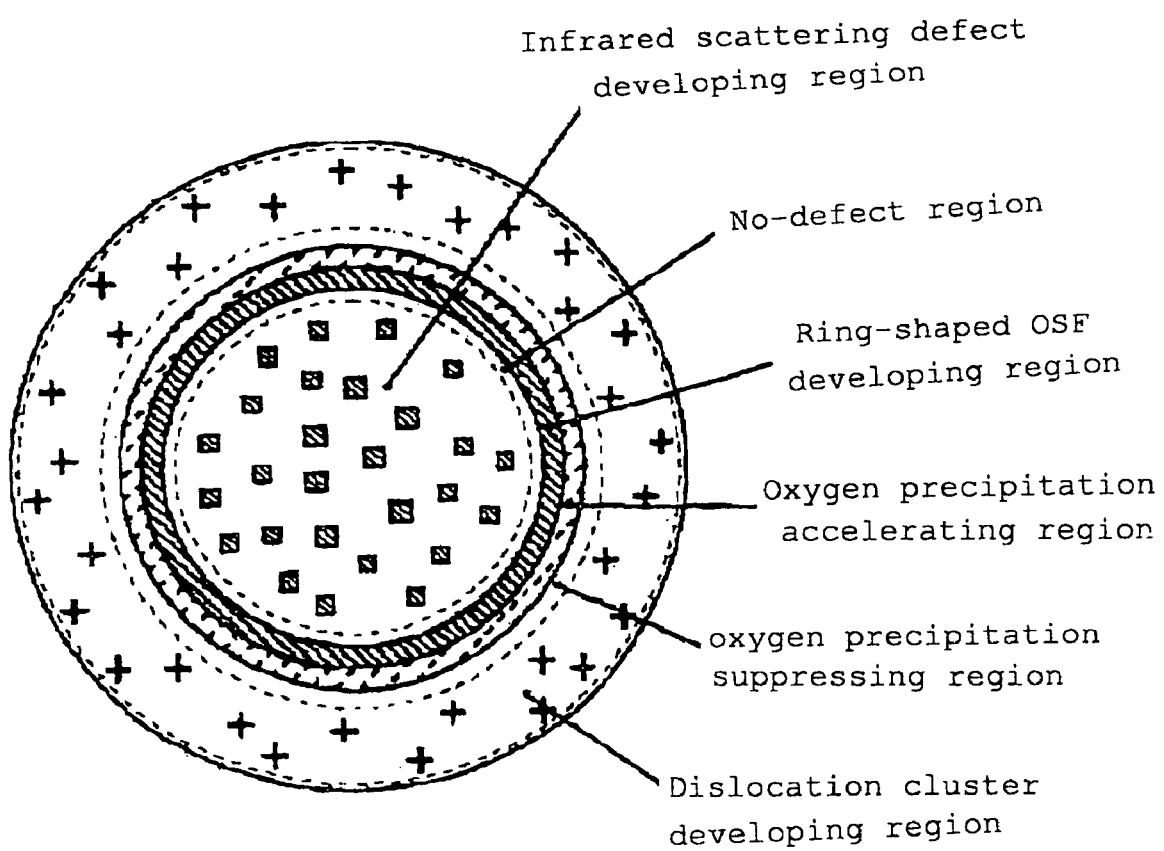
FIG. 2 is a lateral sectional view showing a general distribution of a crystal defect in the diameter direction.
Figure 3:
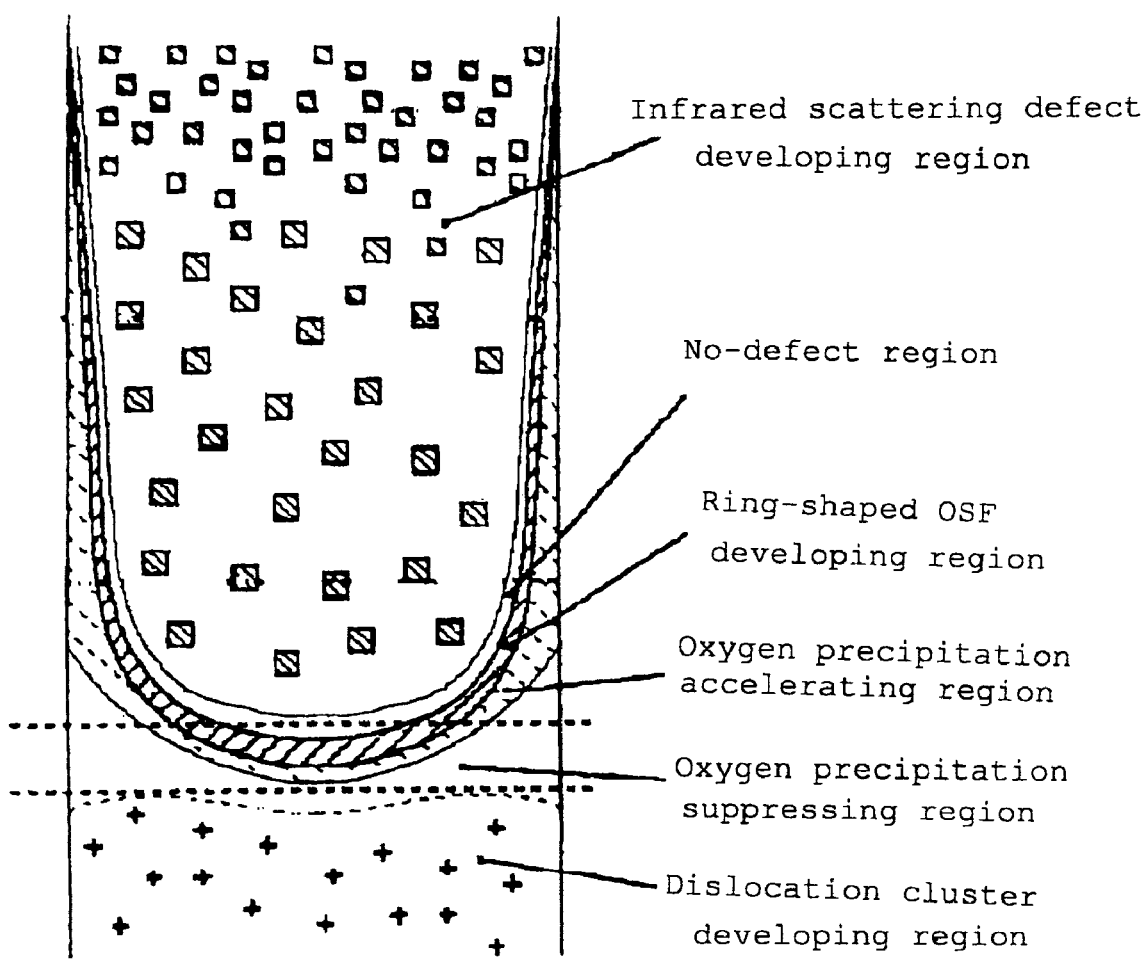
FIG. 3 is a vertical sectional view showing a positional variation of the distribution of the crystal defect when a crystal pulling speed is varied.

According to this embodiment, a crystal free from the COP shown by A-B in FIG. 3 is grown lengthwise in the pulling axis direction by a CZ pulling apparatus in which a hot zone and the like is devised, and a silicon wafer having no defect on the whole surface is provided from the crystal part at steps S1 and S2. More specifically, the wafer having no defect in which a density of the grown-in defect is $1 \times 10^3$ cm$^{-3}$ or less, which is detected by seco etching. This primary substrate has high oxygen [an oxygen concentration is $14 \times 10^{17}$ atoms/cm$^3$ (ASTM F-121, 1979) or more] and high resistance (100 Ωm or more).

In order to improve the mechanical strength, carbon doping ($0.5 \times 10^{16}$ atoms/cm$^3$ or more) can be performed at step S3. In this case, since growth of the oxygen precipitate (BMD) on the wafer surface layer is promoted in the subsequent heat treatment, the oxygen concentration in the primary substrate is allowed to be $12 \times 10^{17}$ atoms/cm$^3$ (ASTM F-121, 1979) or more.

If required, an oxygen outward diffusion heat treatment is performed on the primary substrate at 1100 to 1250° C. for 1 to 5 hours at step S4. The oxygen precipitate (BMD) is prevented from being formed in the subsequent heat treatment, by this oxygen outward diffusion heat treatment. Thus, a DZ (Denuded Zone) layer is formed at least 5 μm or more in depth from the surface of the product wafer. This oxygen outward diffusion heat treatment is performed in an atmosphere of mixed gas of nitrogen gas and oxygen gas and hydrogen annealing or argon annealing should not be performed.

Then, as a heat treatment for forming an oxygen precipitate nucleus, a low-temperature heat treatment is performed on the primary substrate as thus provided at 500 to 900° C. and preferably 700° C. or more for 5 hours or more at step S5. Then, as a heating treatment for growing an oxygen precipitate, a middle-temperature heat treatment is performed at 950 to 1050° C. for 10 hours or more at step S6.

In stead of the outward diffusion heat treatment, a RTA process can be performed at 1150 to 1300° C. for 1 to 60 seconds in a nitrogen gas atmosphere. In a case of a crystal comprising mixed crystal regions, the RTA process is preferable but in a case of a crystal comprising the same crystal region, either one may be performed. In addition, as described above, when the primary substrate having a high concentration, that is, the primary substrate having oxygen concentration of $15 \times 10^{17}$ atoms/cm$^3$ (ASTM F-121, 1979) or more is used, the heat treatment for forming the oxygen precipitate nucleus is not necessary.

By these heat treatments, the oxygen precipitate (BMD) having a size of 0.2 μm or more is formed at a density of $1 \times 10^7$/cm$^2$ or more in a silicon wafer having high resistance of 100 Ωm or more, and the oxidation concentration in the wafer is reduced to $12 \times 10^{17}$ atoms/cm$^3$ (ASTM F-121, 1979) or less at step S7.

As concrete values, the oxygen concentration (ASTM F-121, 1979) in the wafer is $12 \times 10^{17}$ atoms/cm$^3$ or less when resistivity of the wafer is not less than 100 Ωcm and less than 300 Ωcm, $7 \times 10^{17}$ atoms/cm$^3$ or less when the resistivity is not less than 300 Ωcm and less than 2000 Ωcm, and $5.8 \times 10^{17}$ atoms/cm$^3$ or less when the resistivity is not less than 2000 Ωcm in order to effectively prevent a thermal donor.

The characteristics of the product of the silicon wafer as thus manufactured is described below.

First, since a general-purpose silicon wafer having a relatively high oxygen concentration is used as the primary substrate, it is economically efficient. Secondly, since a large-sized oxygen precipitate (BMD) is formed at high density, it has an excellent gettering ability. Thirdly, a final oxygen concentration is low and an oxygen thermal donor is prevented from generating in a heat treatment for forming a circuit which is implemented by the device maker. Fourthly, as a crystal free from the COP is used, when the oxygen outward diffusion heat treatment is performed, it can be performed in an atmosphere containing nitrogen gas, so that hydrogen annealing or argon annealing can be avoided. Therefore, resistance variation caused by the annealing can be also avoided. Nevertheless, there is no grown-in defect and the density of the LPD (Light Point Defect) having a size of 0.12 μm observed on the wafer surface can be reduced to 0.2/cm$^2$ or less.

When carbon doping is performed in the stage of growing the crystal, mechanical strength becomes high. The product in which a DZ (Denuded Zone) layer is formed on the surface layer by performing the oxygen outward diffusion heat treatment or the RTA process on the primary substrate is superior in device characteristics.

Next, an effect of the present invention is clarified by comparing working examples of the present invention with comparative examples.

COMPARATIVE EXAMPLE 1

There were prepared a plurality of 8-inch n-type of sample wafers which were cut out from a normally formed silicon single crystal ingot and on which an oxygen donor eliminating heat treatment was performed at 650° C. for 30 minutes so as to have resistivity of about 1300 Ωcm and an oxygen concentration (ASTM F-121, 1979) of about $13 \times 10^{17}$ atoms/cm$^3$. Then, a density of a grown-in defect existing in the wafer and a density of the oxygen precipitate (BMD) having a size of 0.2 μm or more were measured. The measurement was performed as will be described below. As a result, the density of the grown-in defect existing in the wafer was $3.05 \times 10^5$/cm$^3$ and the oxygen precipitate was $1 \times 10^3$/cm$^2$ or less.

(Measurement Method of Grown-in Defect Density)
① In order to make the grown-in defect on the wafer surface apparent, the wafer is soaked in an etching solution. A compounding ratio of the etching solution is such that HF:K$_2$Cr$_2$O$_7$ (0.15 mol)=2:1 and a soaked time is 30 minutes.
② An etch-pit (grown-in defect) density on the wafer surface is measured by an optical microscope after etching.

(Measurement Method of BMD Density)
① An evaluation heat treatment is performed at 1000° C. for 16 hours in a dry oxygen atmosphere.
② A thermal oxide film formed in the variation heat treatment is removed by an etching solution of HF:H$_2$O=1:1.
③ After the wafer is cleaved, selective etching is performed in order to make the oxygen precipitate apparent. A compounding ratio of a selective etching solution is such that HF:HNO$_3$:CrO$_3$:Cu(NO$_3$)$_2$:H$_2$O:CH$_3$COOH=1200 cc:600 cc:250 g:40 g:1700 cc:1200 cc. An etching amount is 2 μm at the cleaved surface of the wafer.
④ After the selective etching, the etch-pit density on the wafer cleaved surface is measured by an optical microscope.

In addition, after a thermal donor forming heat treatment was performed on the sample wafer at 350 to 500° C. for 1 hour, its resistivity was measured. Its result is shown in Table 1.

Since a remaining oxygen concentration was high and the oxygen precipitate (BMD) having a size of 0.2 μm or more in which lowering of resistivity was apparent because of the formation of the thermal donor was not observed, the gettering ability is very poor, that is, hardly exists.

TABLE 1

| TD forming heat treatment | Resistivity (Ω · cm) | Substrate type |
|---|---|---|
| Not performed | 1341 | N |
| After heat treatment of 350° C./1 h | 1161 | N |
| After heat treatment of 400° C./1 h | 494 | N |
| After heat treatment of 450° C./1 h | 137 | N |
| After heat treatment of 500° C./1 h | 44.8 | N |

COMPARATIVE EXAMPLE 2

There were prepared a plurality of 8-inch p-type of sample wafers which were cut out from a normally formed silicon single crystal ingot and on which an oxygen donor eliminating heat treatment was performed at 650° C. for 30 minutes so as to have resistivity of about 750 Ωcm and an oxygen concentration (ASTM F-121, 1979) of about $15 \times 10^{17}$ atoms/cm$^3$. Then, similar to the comparative example 1, a density of a grown-in defect and a density of an oxygen precipitate (BMD) having a size of 0.2 μm or more were measured. Also, resistivity after a thermal donor forming heat treatment was measured. As a result, the density of the grown-in defect was $2.77 \times 10^5$/cm$^3$ and the oxygen precipitate (BMD) having a size of 0.2 μm or more was $1 \times 10^3$/cm$^2$ or less.

A result of resistivity measured after the thermal donor forming heat treatment is shown in Table 2.

A remaining oxygen concentration was high and variation in resistivity because of the formation of the thermal donor was apparent, and when the heat treatment temperature is 450° C. and 500° C., conversion from p type to n type was observed. In addition, the density of the oxygen precipitate (BMD) having the size of 0.2 μm or more was $1\times10^3/cm^2$ or less, the gettering ability is very poor.

TABLE 2

| TD forming heat treatment | Resistivity (Ω · cm) | Substrate type |
|---|---|---|
| Not performed | 747.3 | p |
| After heat treatment of 350° C./1 h | 926.0 | p |
| After heat treatment of 400° C./1 h | 2300 | p |
| After heat treatment of 450° C./1 h | 147 | Conversion to n type |
| After heat treatment of 500° C./1 h | 14.4 | Conversion to n type |

COMPARATIVE EXAMPLE 3

There were prepared a plurality of 8-inch p-type of sample wafers which were cut out from a normally formed silicon single crystal ingot and on which an oxygen donor eliminating heat treatment was performed at 650° C. for 30 minutes so as to have resistivity of about 175 Ωcm and an oxygen concentration (ASTM F-121, 1979) of about $7\times10^{17}$ atoms/cm$^3$. Then, a heat treatment for forming an oxygen precipitate nucleus and a heat treatment for growing the oxygen precipitate were performed.

In the heat treatment for forming the oxygen precipitate nucleus, after the wafer was put in a reaction furnace which was held at 550° C., the reaction furnace was heated up to 850° C. and held at 850° C. for 1 hour and then the wafers were taken out from the furnace. The heating speed or the like was adjusted such that a total stay time from a start of heating to an end of the heat treatment at 850° C. for 1 hour might be 5 to 26 hours. The atmosphere in the furnace was nitrogen and oxygen mixed gas atmosphere (the ratio of nitrogen gas: oxygen gas was 100:3). In addition, in the heat treatment for growing the oxygen precipitate, the wafers were heated at 1000° C. for 16 hours in the dry oxygen atmosphere.

After the heat treatments, similar to the comparative example 1, a density of a grown-in defect existing in the waver and a density of the oxygen precipitate (BMD) having a size of 0.2 μm or more were measured. In addition, resistivity after a heat treatment for forming a thermal donor was measured. Furthermore, a density of the grown-in defect of the sample wafer before the heat treatment for forming the oxygen precipitate was measured in the same manner in the comparative example 1. The result is shown in Table 3.

TABLE 3

| TD forming heat treatment | Resistivity (Ω · cm) | Substrate type |
|---|---|---|
| Not performed | 175.5 | p |
| After heat treatment of 350° C./1 h | 178 | p |
| After heat treatment of 400° C./1 h | 178 | p |
| After heat treatment of 450° C./1 h | 176 | p |
| After heat treatment of 500° C./1 h | 180 | p |

Since the wafer having low initial oxygen concentration was used, the variation of the resistivity caused by the formation of the thermal donor is small. However, since the oxygen precipitate (BMD) having a size of 0.2 μm or more is not observed, the gettering ability cannot be expected at all. The density of the grown-in defect was $3.15\times10^5/cm^3$.

Since the wafer having low initial oxygen concentration was used, the variation of the resistivity caused by the formation of the thermal donor is small. However, since the oxygen precipitate (BMD) having a size of 0.2 μm or more is not observed, the gettering ability cannot be expected at all. The density of the grown-in defect was $3.15\times10^5/cm^3$.

COMPARATIVE EXAMPLE 4

There were prepared a plurality of 8-inch p-type of sample wafers which were cut out from a normally formed silicon single crystal ingot and on which an oxygen donor eliminating heat treatment was performed at 650° C. for 30 minutes so as to have resistivity of about 750 Ωcm and an oxygen concentration (ASTM F-121, 1979) of about $15\times10^{17}$ atoms/cm$^3$. Then, a heat treatment for forming an oxygen precipitate nucleus and the heat treatment for growing the oxygen precipitate were performed in the same manner as described above.

After the heat treatments, a remaining oxygen concentration in the wafer was measured by infrared absorption analysis and like in the comparative example 1, a density of the oxygen precipitate (BMD) having a size of 0.2 μm or more existing in the wafer was measured, and resistivity after a heat treatment for forming a thermal donor at 350 to 500° C. for 1 hour was measured. In addition, a density of the grown-in defect of the sample wafer before the heat treatment for forming the oxygen precipitate nucleus was measured like in the comparative example 1. The result is shown in Table 4.

TABLE 4

| BMD forming heat treatment | Remaining oxygen concentration ($\times10^{17}$ atoms/cm$^3$) | TD forming heat treatment | Resistivity (Ω · cm) | Substrate type | BMD density ($\times10^{16}$ atoms/cm$^{-2}$) |
|---|---|---|---|---|---|
| Not performed | — | Not performed | 747.3 | p | — |
| Performed | 4.16 to 4.80 | After heat treatment of 350° C./1 h | 1050 to 1169 | p | 3.9 to 7.1 |
| Performed | 4.16 to 4.80 | After heat treatment of 400° C./1 h | 924 to 1072 | p | 3.9 to 7.1 |
| Performed | 4.16 to 4.80 | After heat treatment of 450° C./1 h | 917 to 1067 | p | 3.9 to 7.1 |

TABLE 4-continued

| BMD forming heat treatment | Remaining oxygen concentration (×10$^{17}$ atoms/cm$^3$) | TD forming heat treatment | Resistivity (Ω · cm) | Substrate type | BMD density (×10$^{16}$ atoms/cm$^{-2}$) |
|---|---|---|---|---|---|
| Performed | 4.16 to 4.80 | After heat treatment of 500° C./1 h | 1061 to 1193 | p | 3.9 to 7.1 |

In addition to the fact that a remaining oxygen concentration is low and lowering of the resistivity caused by formation of the thermal donor is small, since the density of the oxygen precipitate (BMD) having the size of 0.2 μm is as high as 3.9 to 7.1×10$^6$/cm$^2$, a sufficient gettering ability can be provided. In addition, the density of the grown-in defect was 2.77×10$^5$/cm$^3$. After the heat treatments, a heat treatment was performed on each sample wafer at 1150° C. for 30 seconds by a RTA apparatus at a lowering temperature rate of 70° C./sec and then a warpage amount was measured by ADE9600 (produced by Japan ADE Co.). It was confirmed that warpage of an average 50 μm was generated and its mechanical strength was small.

COMPARATIVE EXAMPLE 5

There were prepared a plurality of 8-inch p-type of sample wafers which were cut out from a normally formed silicon single crystal ingot and on which an oxygen donor eliminating heat treatment was performed at 650° C. for 30 minutes so as to have resistivity of about 100 to 1500 Ωcm and an oxygen concentration (ASTM F-121, 1979) of about 14 to 17×10$^{17}$ atoms/cm$^3$. Then, after an oxygen outward diffusion heat treatment was performed thereon, a heat treatment for forming an oxygen precipitate nucleus and the heat treatment for growing the oxygen precipitate were performed as described above.

In the oxygen outward diffusion heat treatment, the wafers were put into a reaction furnace which was held at 900° C. in nitrogen and oxygen mixed gas atmosphere (a flow ratio of the nitrogen gas to the oxygen gas was 100:3), and after the furnace temperature was heated up to 1150° C. at speed of 5° C./min, the atmosphere of the furnace was switched to 100% nitrogen gas and the furnace was held at 1150° C. for 2.5 hours. Then, the furnace temperature was lowered to 900° C. at a speed of 4° C./min and the wafers were taken out of the furnace.

After the heat treatments, a remaining oxygen concentration in the wafer was measured by infrared absorption analysis. In addition, like in the comparative example 1, a density of the oxygen precipitate (BMD) having a size of 0.2 μm or more existing in the wafer was measured, and after selective etching in the density measurement of the oxygen precipitate (BMD), the wafer cleaved surface was observed by an optical microscope to measure a thickness of a DZ layer, that was, a distance from the wafer surface until a first etch pit is observed in the wafer depth direction. In addition, a density of the grown-in defect of the sample wafer before the heat treatment for forming the oxygen precipitate nucleus was measured like in the comparative example 1. The result is shown in Table 5.

The remaining oxygen concentration (ASTM F-121, 1979) was as low as about 7 to 12×10$^{17}$ atoms/cm$^3$ and lowering of resistivity because of formation of a thermal donor was small. It was confirmed that the density of the oxygen precipitate (BMD) having a size of 0.2 μm or more was as high as 1.9 to 7.1×10$^6$/cm$^2$ and a gettering ability was excellent. In addition, since the DZ layer having a thickness of 7 μm or more was formed on the surface layer of the wafer and the oxygen precipitate (BMD) did not penetrate the wafer surface, when an evaluation etching amount is considered, it is estimated that the thickness of the DZ layer was provided about 9 μm. However, when generation status of slip dislocation in the sample wafer after the oxygen outward diffusion heat treatment was confirmed by X-ray topography, generation of the slip dislocation of about 20 mm in length was observed at a part corresponding to a position in which the wafer is supported by a supporting member at the time of the oxygen outward diffusion heat treatment, and its mechanical strength was very small. The density of the grown-in defect was about 3×10$^5$/cm$^3$.

TABLE 5

| Initial oxygen concentration (×10$^{17}$ atoms/cm$^3$) | Remaining oxygen concentration (×10$^{17}$ atoms/cm$^3$) | BMD density (/cm$^2$) | DZ width (μm) | Processing time for forming an oxygen precipitate nucleus |
|---|---|---|---|---|
| 13.8 | 11.8 | 1.9e6 | 17 | 26 hours |
| 14.6 | 12.4 | 2.1e6 | 13 | 26 hours |
| 15.1 | 7.4 | 6.9e6 | 9 | 13 hours and 30 minutes |
|  | 11.7 | 2.4e6 | 15 | 7 hours and 15 minutes |
| 15.7 | 7.1 | 7e6 | 8 | 13 hours and 30 minutes |
|  | 11 | 2.5e6 | 13 | 7 hours and 15 minutes |
| 16.2 | 7.5 | 7.1e6 | 7 | 9 hours and 20 minutes |
|  | 11.2 | 2.6e6 | 9 | 6 hours |
| 16.8 | 8.1 | 7e6 | 7 | 7 hours and 15 minutes |
|  | 11.6 | 2.9e6 | 10 | 5 hours and 10 minutes |

COMPARATIVE EXAMPLE 6

There were prepared seven levels (A to G) of 8-inch p-type of sample wafers which were cut out from a normally formed silicon single crystal ingot and on which an oxygen donor eliminating heat treatment was performed at 650° C. for 30 minutes so as to have resistivity of about 100 to 1300 Ωcm and an oxygen concentration (ASTM F-121, 1979) of about 13 to 17×10$^{17}$ atoms/cm$^3$. Then, after an oxygen outward diffusion heat treatment was performed on each wafer, a heat treatment for forming an oxygen precipitate nucleus and a heat treatment for growing the oxygen precipitate were performed. In the oxygen outward diffusion heat treatment, the nitrogen and oxygen mixed gas atmosphere (a flow ratio of the nitrogen gas to the oxygen gas was 100:3) in the comparative example 5 was changed to a hydrogen gas atmosphere or an argon gas atmosphere.

After the heat treatments, a remaining oxygen concentration in the wafer was measured by infrared absorption analysis and resistivity of the wafer after a heat treatment for forming a thermal donor performed at 450° C. for 1 hour was measured to examine variation of the resistivity by the oxygen concentration. In addition, like in the comparative example 1, a density of the oxygen precipitate (BMD) having a size of 0.2 μm or more existing in the wafer was measured, and after selective etching in the density measurement of the oxygen precipitate (BMD), the waver cleaved surface was observed by an optical microscope to measure a thickness of a DZ layer, that is, a distance from the wafer surface to a first etch pit in the wafer depth direction. The result is shown in Table 6.

The sample wafers on which the oxygen outward diffusion heat treatment was performed in the hydrogen gas were A, C and E, and the sample wafers on which the oxygen outward diffusion heat treatment was performed in the argon gas were B, D, F and G. The density of the oxygen precipitate (BMD) having a size of 0.2 μm or more was as high as $1 \times 10^6/cm^2$ and a gettering ability was excellent. In addition, since the DZ layer having a thickness of 5 μm or more was formed on the surface layer of the wafer and the oxygen precipitate (BMD) did not penetrate the wafer surface, when an evaluation etching amount is considered, it was estimated that the thickness of the DZ layer was provided about 7 μm. However, when generation status of slip dislocation in the sample wafer after the oxygen outward diffusion heat treatment was confirmed by X-ray topography, generation of the slip dislocation of about 20 mm in length was observed at a part corresponding to a position in which the wafer was supported by a supporting member at the time of the oxygen outward diffusion heat treatment, and its mechanical strength was very small.

the sample wafers A to F in which the remaining oxygen concentration (ASTM F-121, 1979) to the initial resistivity is lowered to be in the above appropriate range, the variation of the resistivity because of the formation of the thermal donor is small. Meanwhile, according to the sample wafer G, since a time of oxygen outward diffusion heat treatment is short, the remaining oxygen concentration to the initial resistivity is high, so that it was observed that the p type was converted to the n type after the thermal donor heat treatment.

In addition, the number of LPDs (Light Point Defect) having a size of 0.12 μm or more on the wafer surface of each of the samples A, C and F was examined by a laser particle counter before and after the oxygen outward diffusion heat treatment. The result is shown in Table 7. A maximum number was 3 per wafer ($0.01/cm^2$) after the heat treatment.

TABLE 7

| Sample | The number of LPD of 0.12 μm or more (the number/wafer) | |
|---|---|---|
| | Before heat treatment | After heat treatment |
| A | 52 | 2 |
| C | 52 | 3 |
| F | 39 | 1 |

WORKING EXAMPLE 1

There were prepared a plurality of 8-inch p-type of sample wafers which were cut out from a normally formed silicon single crystal ingot and on which an oxygen donor eliminating heat treatment was performed at 650° C. for 30 minutes so as to have resistivity of about 750 Ωcm, an oxygen concentration (ASTM F-121, 1979) of about $11 \times 10^{17}$ atoms/cm$^3$ and

TABLE 6

| Sample | Initial oxygen concentration ($\times 10^{17}$ atoms/cm$^3$) | Remaining oxygen concentration ($\times 10^{17}$ atoms/cm$^3$) | BMD density (/cm$^2$) | DZ width (μm) | Processing time for forming oxygen precipitate nucleus | Initial resistivity (Ω·cm) | Resistivity after TD formed (Ω·cm) |
|---|---|---|---|---|---|---|---|
| A | 13.5 | 12.1 | 1e6 | 15 | 26 hours | 133 | 221 |
| B | 14.7 | 12.4 | 1.7e6 | 11 | 26 hours | 200 | 531 |
| C | 15.0 | 7.2 | 5.1e6 | 8 | 13 hours and 30 minutes | 1003 | 1559 |
| D | 15.5 | 7.5 | 7.4e6 | 8 | 13 hours and 30 minutes | 1314 | 3097 |
| E | 16.2 | 7.4 | 7.4e6 | 5 | 9 hours and 20 minutes | 660 | 960 |
| F | 17.3 | 6.8 | 7.4e6 | 6 | 7 hours and 15 minutes | 820 | 1160 |
| G | | 11.1 | 4e6 | 8 | 4 hours and 50 minutes | 786 | Conversion to n type |

In addition, according to the result in which the variation of the resistivity caused by the oxygen concentration was examined, there was no conversion between n type and p type, and the oxygen concentration in which the variation of the resistivity did not exceed 10 times as large as the initial value was $12 \times 10^{17}$ atoms/cm$^3$ or less when the initial resistivity was not less than 100 Ωcm and less than 300 Ωcm, $7 \times 10^{17}$ atoms/cm$^3$ or less when the resistivity was not less than 300 Ωcm and less than 2000 Ωcm, and $5.8 \times 10^{17}$ atoms/cm$^3$ or less when the resistivity was not less than 2000 Ωcm. That is, according to a carbon concentration of about $1 \times 10^{16}$ atoms/cm$^3$. Then, a heat treatment for forming an oxygen precipitate nucleus and a heat treatment for growing the oxygen precipitate were performed like in the comparative example 3 so that a remaining oxygen concentration (ASTM F-121, 1979) might be about $4.5 \times 10^{17}$ atoms/cm$^3$.

When a density of oxygen precipitate (BMD) having a size of 0.2 μm or more existing in the wafer was measured, it was 4.3 to $6.2 \times 10^6/cm^2$ which was about the same as that in the comparative example 4, in which the remaining oxygen concentration (ASTM F-121, 1979) was lowered from the initial oxygen concentration (ASTM F-121, 1979) of about $15 \times 10^{17}$ atoms/cm$^3$ to about $4.5 \times 10^{17}$ atoms/cm$^3$. When a density of grown-in defect on the sample wafer before the heat treatment for forming the oxygen precipitate nucleus was measured like in the comparative example 1, the density of the grown-in defect was $3.2 \times 10^5$/cm$^3$. In addition, after the heat treatments were performed on each sample wafer, a heat treatment was performed on each wafer at 1150° C. for 30 seconds at a lowering temperature rate of 70° C./sec by the RTA apparatus. Then, when a warpage amount was measured by ADE9600 (produced by Japan ADE Co.), it was confirmed that warpage was an average 5 μm or less and its mechanical strength was excellent.

WORKING EXAMPLE 2

There were prepared a plurality of 8-inch p-type of sample wafers which were cut out from a normally formed silicon single crystal ingot and on which an oxygen donor eliminating heat treatment was performed at 650° C. for 30 minutes so as to have resistivity of about 750 Ωcm, an oxygen concentration (ASTM F-121, 1979) of about $15 \times 10^{17}$ atoms/cm$^3$ and a carbon concentration of about $1 \times 10^{16}$ atoms/cm$^3$. Then, a heat treatment for forming an oxygen precipitate nucleus and a heat treatment for growing the oxygen precipitate were performed like in the comparative example 3 so that a remaining oxygen concentration (ASTM F-121, 1979) might be about $4.5 \times 10^{17}$ atoms/cm$^3$.

When a density of oxygen precipitate (BMD) having a size of 0.2 μm or more existing in the wafer was measured, it was 6.4 to $7.7 \times 10^6$/cm$^2$ which was considerably higher than that in the comparative example 4, in which the remaining oxygen concentration (ASTM F-121, 1979) was lowered from the initial oxygen concentration (ASTM F-121, 1979) of about $15 \times 10^{17}$ atoms/cm$^3$ to about $4.5 \times 10^{17}$ atoms/cm$^3$. When a density of grown-in defect on the sample wafer before the heat treatment for forming the oxygen precipitate nucleus was measured like in the comparative example 1, the density of the grown-in defect was $3.4 \times 10^5$/cm$^3$. In addition, after the heat treatments was performed on each sample wafer, a heat treatment was performed at 1150° C. for 30 seconds at a lowering temperature rate of 70° C./sec by a RTA apparatus. Then, when a warpage amount was measured by ADE9600 (produced by Japan ADE Co.), it was confirmed that warpage was an average 5 μm or less and its mechanical strength was excellent.

WORKING EXAMPLE 3

There were prepared a plurality of 8-inch p-type of sample wafers which were cut out from a normally formed silicon single crystal ingot and on which an oxygen donor eliminating heat treatment was performed at 650° C. for 30 minutes so as to have resistivity of about 110 to 2500 Ωcm, an oxygen concentration (ASTM F-121, 1979) of about 14 to $16.5 \times 10^{17}$ atoms/cm$^3$ and a carbon concentration of about 0.5 to $20 \times 10^6$ atoms/cm$^3$. Then, an oxygen outward diffusion heat treatment, a heat treatment for forming an oxygen precipitate nucleus and a heat treatment for growing the oxygen precipitate were performed like in the comparative example 5 so that a remaining oxygen concentration (ASTM F-121, 1979) might be reduced to about 4.5 to $6 \times 10^{17}$ atoms/cm$^3$.

Figure 6:
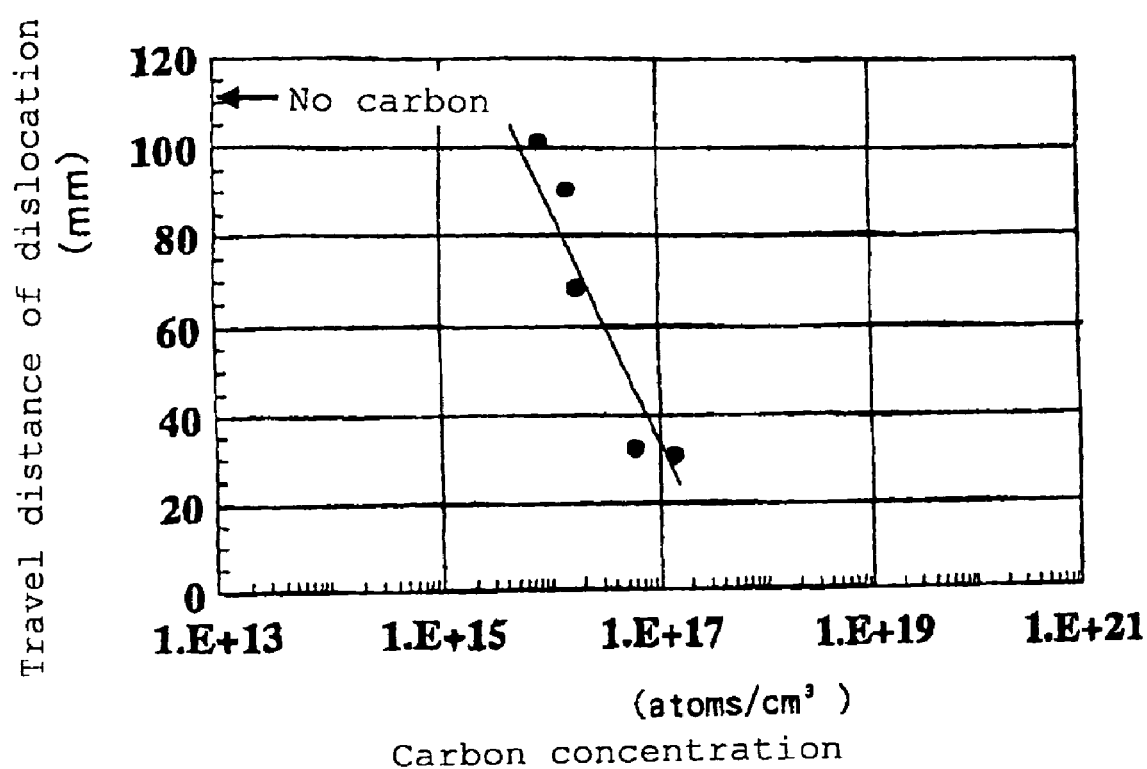
FIG. 6 is a graph showing a relation between a carbon concentration and a dislocation travel distance in a wafer.

Vickers indentation was introduced into the sample wafer after the heat treatments at a room temperature and then a heat treatment was performed at 900° C. for 30 minutes. Thus, a travel distance of dislocation generated from the indentation track after the heat treatment was measured by an optical microscope after the selective etching. A relation between the travel distance of the measured dislocation and a carbon concentration in the wafer is shown in FIG. 6. Although a large-sized oxygen precipitate (BMD) existed at high density in the wafer, as the carbon concentration was increased, the mechanical strength of the wafer was effectively improved.

WORKING EXAMPLE 4

There were prepared three levels (Z1 to Z3) of 8-inch p-type of sample wafers which were cut out from a normally formed silicon single crystal ingot and on which an oxygen donor eliminating heat treatment was performed at 650° C. for 30 minutes so as to have resistivity of about 500 to 2500 Ωcm, an oxygen concentration (ASTM F-121, 1979) of about $15 \times 10^{17}$ atoms/cm$^3$ and a carbon concentration of about 1 to $2 \times 10^{16}$ atoms/cm$^3$. Then, after an oxygen outward diffusion heat treatment was performed on each wafer, a heat treatment for forming an oxygen precipitate nucleus and a heat treatment for growing the oxygen precipitate were performed. In the oxygen outward diffusion heat treatment, the nitrogen and oxygen mixed gas atmosphere (a flow ratio of the nitrogen gas to the oxygen gas was 100:3) in the comparative example 3 was changed to a hydrogen gas atmosphere or an argon gas atmosphere.

After the heat treatments, a remaining oxygen concentration in the wafer was measured by infrared absorption analysis and the resistivity of the wafer after a heat treatment for forming a thermal donor performed at 450° C. for 1 hour was measured to examine variation of the resistivity because of the oxygen concentration. In addition, a density of the oxygen precipitate (BMD) having a size of 0.2 μm or more existing in the wafer was measured, and after the selective etching in the density measurement of the oxygen precipitate (BMD), the wafer cleaved surface was observed by an optical microscope to measure a thickness of a DZ layer, that was, a distance from the wafer surface to a first etch pit in the wafer depth direction. The result is shown in Table 8.

TABLE 8

| Sample | Carbon concentration ($\times 10^{16}$ atoms/cm$^3$) | Initial oxygen concentration ($\times 10^{17}$ atoms/cm$^3$) | Remaining oxygen concentration ($\times 10^{17}$ atoms/cm$^3$) | BMD density (/cm$^2$) | DZ width (μm) | Processing time for forming oxygen precipitate nucleus | Initial resistivity (Ω·cm) | Resistivity after TD formed (Ω·cm) |
|---|---|---|---|---|---|---|---|---|
| Z1 | 1.0 | 15.2 | 4.6 | 6.6e6 | 10 | 16 hours | 2518 | 17000 |
| Z2 | 2.0 | 14.8 | 4.2 | 5.8e6 | 8 | 11 hours | 1232 | 1987 |
| Z3 | 1.1 | 15.1 | 2.8 | 7.2e6 | 8 | 51 hours | 521 | 725 |

Z1 and Z2: hydrogen annealing
Z3: Ar annealing

The sample wafers on which the oxygen outward diffusion heat treatment was performed in the hydrogen gas were Z1 and Z2, and the sample wafer on which the oxygen outward diffusion heat treatment was performed in the argon gas was Z3. Since the remaining oxygen concentration was sufficiently reduced in each wafer, lowering of resistivity because of formation of the thermal donor was small. In addition, the density of the oxygen precipitate (BMD) having a size of 0.2 μm was as high as $5 \times 10^6/cm^2$ or more and a gettering ability was excellent. In addition, since the DZ layer having a thickness of 8 μm or more was formed on the surface layer of the wafer and the oxygen precipitate (BMD) did not penetrate the wafer surface, when an evaluation etching amount was considered, it was estimated that the thickness of the DZ layer was provided about 10 μm.

In addition, when generation status of slip dislocation in the sample wafer after the oxygen outward diffusion heat treatment was confirmed by X-ray topography, generation of the slip dislocation of only about 2 to 3 mm in length was observed at a part corresponding to a position in which the wafer was supported by a supporting member at the time of the oxygen outward diffusion heat treatment, and even if the additional heat treatment was performed at 1150° C. for 1 hour, the length of the slip dislocation was not changed and its mechanical strength was excellent.

In addition, the number of LPD (Light Point Defect) having a size of 0.12 μm or more on the wafer surface of each of the samples Z1 to Z3 was examined by a laser particle counter before and after the oxygen outward diffusion heat treatment. The result is shown in Table 9. A maximum number was 3 per wafer (0.01/cm³) after the heat treatment.

TABLE 9

| Sample | The number of LPD of 0.12 μm or more (the number/wafer) | |
|---|---|---|
| | Before heat treatment | After heat treatment |
| Z1 | 59 | 3 |
| Z2 | 38 | 3 |
| Z3 | 49 | 1 |

WORKING EXAMPLE 5

There were prepared 6 levels (H to M) of 8-inch p-type of sample wafers which were cut out from a normally formed silicon single crystal ingot and on which an oxygen donor eliminating heat treatment was performed at 650° C. for 30 minutes so as to have resistivity of about 100 to 1000 Ωcm, an oxygen concentration (ASTM F-121, 1979) of about 13 to $17 \times 10^{17}$ atoms/cm³ and a carbon concentration of about 1 to $2 \times 10^{16}$ atoms/cm³. Then, after an oxygen outward diffusion heat treatment was performed on each wafer like in the working example 4, a heat treatment for forming an oxygen precipitate nucleus and a heat treatment for growing the oxygen precipitate were performed. In the oxygen outward diffusion heat treatment, the processing temperature and time were set at 1100° C. for 5 hours or 1200° C. for 1 hour so that an oxygen diffusion distance might become the same as that performed at 1150° C. for 2.5 hours in the working example 4.

After the heat treatments, the sample wafer was divided into two. According to one wafer, a remaining oxygen concentration in the wafer was measured by infrared absorption analysis and after a heat treatment for forming a thermal donor was performed at 450° C. for 1 hour, resistivity of the wafer was measured to examine variation of the resistivity caused by the oxygen concentration. In addition, according to the other wafer, the wafer was cleaved and after the selective etching, the wafer cleaved surface was observed by an optical microscope to measure a thickness of a DZ layer, that was, a distance from the wafer surface to a first etch pit in the wafer depth direction. The result is shown in Table 10.

TABLE 10

| Sample | Initial oxygen concentration ($\times 10^{17}$ atoms/cm³) | Conditions of oxygen outward diffusion treatment | Remaining oxygen concentration ($\times 10^{17}$ atoms/cm³) | DZ width (μm) | Initial resistivity (Ω · cm) | Resistivity after TD formed (Ω · cm) |
|---|---|---|---|---|---|---|
| H | 13.3 | 1100° C./5 hours | 12 | 6 | 108 | 213 |
| I | | 1200° C./1 hour | 11.8 | 10 | 210 | 518 |
| J | 15.2 | 1100° C./5 hours | 7.1 | 5 | 1032 | 1629 |
| K | | 1200° C./1 hour | 7.3 | 7 | 939 | 1788 |
| L | 16.7 | 1100° C./5 hours | 7.4 | 5 | 722 | 1088 |
| M | | 1200° C./1 hour | 7 | 8 | 879 | 1276 |

The sample wafers on which the oxygen outward diffusion heat treatment was performed in the hydrogen gas were H, I, L and M, and the sample wafers on which the oxygen outward diffusion heat treatment was performed in the argon gas were J and K. Even when the oxygen diffusion conditions were changed from 1100° C. for 5 hours to 1200° C. for 1 hour, the thickness of the DZ layer could be secured as much as that in the working example 4, the remaining oxygen concentration could be controlled at the same degree and the variation of the resistivity could be suppressed at the same degree.

In addition, when generation status of slip dislocation in the sample wafer after the oxygen outward diffusion heat treatment was confirmed by X-ray topography like in the working example 4, generation of the slip dislocation was not observed in the sample wafers I, K and M on which the oxygen outward diffusion heat treatment was performed for 1 hour, while the slip dislocation which was as much as that in the working example 4 was observed only in the sample wafers H, J and L on which the oxygen outward diffusion heat treatment was performed for 5 hours.

In addition, the number of LPDs (Light Point Defect) having a size of 0.12 μm or more on the wafer surface of each of the samples H, J, K and M was examined by a laser particle counter before and after the oxygen outward diffusion heat treatment. The result is shown in Table 11. A maximum number was 4 per wafer (0.01/cm$^3$) after the heat treatment.

TABLE 11

| Sample | The number of LPD of 0.12 μm or more (the number/wafer) | |
|---|---|---|
| | Before heat treatment | After heat treatment |
| H | 47 | 4 |
| J | 58 | 1 |
| K | 62 | 2 |
| M | 51 | 1 |

WORKING EXAMPLE 6

There were prepared a silicon single crystal ingot free from the COP consisting of an oxygen precipitation accelerating region only, in which a density of a grown-in defect is 1×10$^3$/cm$^3$ or less, and a silicon single crystal ingot free from the COP consisting of two kinds of regions such as the oxygen precipitation accelerating region in which a density of a grown-in defect is 1×10$^3$/cm$^3$ or less and an oxygen precipitate suppressing region. There were provided 7 levels (N to T) of 6-inch p-type of wafers cut out from the above ingots, on which an oxygen donor eliminating heat treatment was performed at 650° C. for 30 minutes so as to have resistivity of about 100 to 900 Ωcm and an oxygen concentration (ASTM F-121, 1979) of about 14 to 17×10$^{17}$ atoms/cm$^3$. Then, after an oxygen outward diffusion heat treatment was performed on them at 1150° C. for 2.5 hours, a heat treatment for forming an oxygen precipitate nucleus was performed 550 to 850° C. for 5 to 26 hours and a heat treatment for growing the oxygen precipitate was performed at 1000° C. for 16 hours. The heat treatments conditions are described below in detail.

In the oxygen outward diffusion heat treatment, the wafers were put into a reaction furnace which is held at 900° C., and the furnace temperature was raised to 1150° C. at a speed of 5° C./min. The atmosphere at this time was a nitrogen and oxygen mixed gas atmosphere (a flow ratio of the nitrogen gas to the oxygen gas was 100:3) and after the furnace temperature was heated up to 1150° C., the atmosphere of the furnace was switched to 100% nitrogen gas and the furnace was held for 2.5 hours. Then, the furnace temperature was lowered to 900° C. at a speed 4° C./min and the wafers were taken out of the furnace at 900° C. The heat treatment for forming the oxygen precipitate nucleus following the oxygen outward diffusion heat treatment was also performed in the 100% nitrogen gas atmosphere.

The oxygen precipitation accelerating region has characteristics in which when the heat treatment is performed at high temperature for a long time in an oxygen gas atmosphere, an OSF is generated and when the heat treatment is performed in the 100% nitrogen gas, nitride is generated on the surface to cause the surface to get rough. The gas atmosphere was examined so as not to generate the above problems and decided as described above.

After the heat treatments, the sample wafer was divided into two. Then, according to one wafer, a remaining oxygen concentration in the wafer was measured by infrared absorption analysis. Then, the wafer was cleaved and the cleaved surface was etched away by 2 μm by selective etching and a thickness of a DZ layer was measured by the above method using the optical microscope. In addition, a density of the oxygen precipitate (BMD) having a size of 0.2 μm or more was measured. According to the other wafer, after the heat treatment for forming a thermal donor was performed at 450° C. for 1 hour, a resistivity was measured to examine variation of the resistivity because of the oxygen concentration. The result is shown in Table 12.

TABLE 12

| Sample | Initial oxygen concentration (×10$^{17}$ atoms/cm$^3$) | Remaining oxygen concentration (×10$^{17}$ atoms/cm$^3$) | BMD density (/cm$^2$) | DZ width (μm) | Processing time for forming oxygen precipitate nucleus | Initial resistivity (Ω·cm) | Resistivity after TD formed (Ω·cm) |
|---|---|---|---|---|---|---|---|
| N | 13.7 | 11.6 | 2.2e6 | 15 | 26 hours | 194 | 382 |
| O | 15.4 | 11.9 | 2.2e6 | 11 | 7 hours and 15 minutes | 101 | 139 |
| P | | 7.4 | 7.1e6 | 8 | 13 hours and 30 minutes | 133 | 152 |
| Q | 17.1 | 10.6 | 4.8e6 | 8 | 5 hours and 10 minutes | 544 | Conversion to n type |
| R | | 7.1 | 7.4e6 | 5 | 7 hours and 15 minutes | 583 | 621 |
| S | 13.7 | Center 11.6 | 2.2e6 | 15 | 26 hours | 194 | 382 |
| | | Periphery 11.7 | 2.3e6 | 15 | | 200 | 390 |
| T | 14.2 | Center 7.1 | 6.6e6 | 9 | 15 hours and 20 minutes | 868 | 1823 |
| | | Periphery 11.2 | 1.8e6 | 10 | | 912 | Conversion to n type |

N to S: formed by oxygen precipitation accelerating region only
T: formed by two kinds of regions of oxygen precipitation accelerating region and oxygen precipitation suppressing region The samples N to S are wafers free from the COP consisting of the oxygen precipitation accelerating regions only. The sample T is a wafer free from the COP consisting of two kinds of regions such as the oxygen precipitation accelerating region and the oxygen precipitation suppressing region, in which the center of the wafer is in the oxygen precipitation accelerating region and a peripheral part within 20 mm from the periphery is in the oxygen precipitation suppressing region. According to the samples S and T, each measurement of the remaining oxygen concentration, the oxygen precipitate density, the DZ layer thickness and resistivity was performed at the center part and the peripheral part of 20 mm from the periphery. According to other samples, the measurements were performed only at the center part of the wafer.

Since the DZ layer having a thickness of 5 μm or more was formed on the surface layer in every sample and the oxygen precipitate (BMD) did not penetrate the wafer surface, when an evaluation etching amount was considered, it was estimated that the thickness of the DZ layer was provided about 7 μm. The remaining oxygen concentration can be reduced to 7 to $12\times10^{17}$ atoms/cm$^3$.

In addition, the substrate oxygen concentration (including the remaining oxygen concentration after the oxygen precipitation process) in which the type is not converted and the variation of the resistivity dose not exceed 10 times as large as the initial value is $12\times10^{17}$ atoms/cm$^3$ or less when the initial resistivity is not more than 300 Ωcm, $8\times10^{17}$ atoms/cm$^3$ or less when the resistivity is less than 2000 Ωcm, and $5.8\times10^{17}$ atoms/cm$^3$ or less when the resistivity is not less than 2000 Ωcm.

According to the samples N to S comprising the oxygen precipitation accelerating region on the whole surface of the wafer, the oxygen precipitate was formed uniformly on the wafer surface and the resistivity varies a little. However, according to the sample T in which the oxygen precipitation accelerating region and the oxygen precipitation suppressing region were mixed, there was a difference in density of the oxygen precipitate on the wafer surface and variation in resistivity because of the formation of the thermal donor in the oxygen precipitation suppressing region (wafer peripheral part) having low density was large, and the resistivity was not uniform on the wafer surface.

According to the sample K on which only the oxygen outward diffusion heat treatment was performed in the argon atmosphere in the above working example 5 and the sample N on which only the oxygen outward diffusion heat treatment was performed in this example, a density of the grown-in defect on the wafer surface was measured using MO601 defect evaluating apparatus produced by Mitsui Mining And Smelting Co., Ltd. This defect evaluating apparatus can detect a defect existing in the inner part of several μm from the wafer surface. The result is as follows According to the sample K on which only the oxygen outward diffusion heat treatment was performed in the argon atmosphere, the defect density of the wafer surface was 0.006 cm$^{-2}$ while the defect density in the inner part of several μm measured by the above defect evaluating apparatus was 3.4 cm$^{-2}$. Meanwhile, according to the sample N (free from the COP) on which only the oxygen outward diffusion heat treatment was performed in this example, the defect density in the inner part of several μm measured by the above defect evaluating apparatus was as low as 0.02 cm$^{-2}$.

As can be seen from the above, according to the heat treatment in the argon atmosphere, only the grown-in defect existing very near the surface of the wafer is eliminated or reduced. In addition, when the heat treatment is performed at high temperature in the hydrogen and argon gas atmosphere, since a natural oxide film formed on the surface by wafer cleaning before the heat treatment is removed and an active silicon surface is exposed, precious metal such as iron which is mixed from an atmosphere at the time of heat treatment or dopant impurity such as boron or phosphor which varies the wafer resistivity could be mixed in the wafer. Therefore, in order to implement high quality, it is preferable to use a crystal free from the COP in which the grown-in defect is reduced from the time of forming the crystal.

WORKING EXAMPLE 7

There were provided a silicon single crystal ingot free from the COP consisting of an oxygen precipitation accelerating region only, in which a density of a grown-in defect was $1\times10^3$/cm$^3$ or less, and a silicon single crystal ingot free from the COP consisting of two kinds of regions such as the oxygen precipitation accelerating region in which a density of a grown-in defect was $1\times10^3$/cm$^3$ or less and an oxygen precipitation suppressing region. The following RTA (Rapid Thermal Anneal) process was performed on 5 levels (U to Y) of 6-inch p-type of wafers provided from the above ingots, on which an oxygen donor eliminating heat treatment was performed at 650° C. for 30 minutes so as to have resistivity of about 300 to 900 Ωcm and an oxygen concentration (ASTM F-121, 1979) of about 13 to $15\times10^{17}$ atoms/cm$^3$.

After the wafers were put in the furnace which was held at 600° C., the furnace was heated up to a predetermined temperature at a heating speed of 50° C./sec and after held for a predetermined time, it was cooled down to 600° C. at a cooling speed of 33° C./sec and then the wafers were taken out of the furnace. The heating temperature, the holding time and atmosphere are as follows.

Wafer U: at 1280° C. for 1 second (nitrogen gas atmosphere)
Wafer V: at 1220° C. for 30 seconds (nitrogen gas atmosphere)
Wafer W: at 1220° C. for 30 seconds (nitrogen gas atmosphere)
Wafer X: at 1280° C. for 1 second (nitrogen gas atmosphere)
Wafer Y: at 1150° C. for 60 seconds (ammonia+argon gas atmosphere)

After the heat treatments, the sample wafer was divided into two. Then, according to one wafer, a remaining oxygen concentration in the wafer was measured by infrared absorption analysis. Then, the wafer was cleaved and the cleaved surface was etched away by 2 μm by selective etching and a thickness of a DZ layer was measured by the above method using the optical microscope. In addition, a density of the oxygen precipitate (BMD) having a size of 0.2 μm was measured. According to the other wafer, after the heat treatment for forming a thermal donor was performed at 450° C. for 1 hour, resistivity was measured to examine variation of the resistivity because of the oxygen concentration. The result is shown in Table 13.

The samples U to X are wafers free from the COP consisting of two kinds of regions such as the oxygen precipitation accelerating region and the oxygen precipitation suppressing region, in which the center of the wafer is in the oxygen precipitation accelerating region and a peripheral part within 20 mm from the periphery is in the oxygen precipition suppressing region. The sample Y is a wafer free from the COP, consisting of only oxygen precipitation accelerating region. Each measurement of the remaining oxygen concentration, the oxygen precipitate density, the DZ layer thickness and the resistivity was performed at the center part and the peripheral part of 20 mm from the periphery. In any sample, the oxygen precipitate is uniformly formed on the wafer surface and also resistivity is uniform on the wafer surface. That is, it is shown that by the RTA process, the resistivity is uniform on the wafer even in the wafer free from the COP in which the oxygen precipitation accelerating region and oxygen precipitation suppressing region are mixed.

Upper part: wafer center part (oxygen precipitation accelerating region) Lower part: a part of 20 mm from wafer periphery In addition, when generation status of slip dislocation in the sample wafer after the oxygen outward diffusion heat

TABLE 13

| Sample | Initial oxygen concentration ($\times 10^{17}$ atoms/cm$^3$) | Remaining oxygen concentration ($\times 10^{17}$ atoms/cm$^3$) | BMD density (/cm$^2$) | DZ width (μm) | Processing time for forming oxygen precipitate nucleus | Initial resistivity (Ω·cm) | Resistivity after TD formed (Ω·cm) |
|---|---|---|---|---|---|---|---|
| U | 14.2 | 5.1 | 9e6 | 9 | 5 hours | 868 | 998 |
|   |      | 5.2 | 9.4e6 | 8 | 5 hours | 912 | 1222 |
| V | 14.2 | 6.4 | 8.2e6 | 9 | 5 hours | 868 | 1120 |
|   |      | 6.3 | 8.3e6 | 9 | 5 hours | 912 | 1213 |
| W | 14.2 | 6.9 | 7.8e6 | 9 | 5 hours | 868 | 1781 |
|   |      | 6.9 | 7.2e6 | 9 | 5 hours | 912 | 2215 |
| X | 13.0 | 11.3 | 1.2e6 | 16 | 10 hours | 280 | 540 |
|   |      | 11.2 | 1.6e6 | 16 | 10 hours | 280 | 550 |
| Y | 15.1 | 5.1 | 9.7e6 | 8 | 5 hours | 580 | 621 |
|   |      | 5.3 | 9.1e6 | 9 | 5 hours | 601 | 623 |

Upper part wafer center part (oxygen precipitation accelerating region) Lower part: a part of 20 mm from wafer periphery

WORKING EXAMPLE 8

There was provided a silicon single crystal ingot free from the COP, consisting of two kinds of regions such as the oxygen precipitation accelerating region in which a density of a grown-in defect is $1\times 10^3$/cm$^3$ or less and an oxygen precipitation suppressing region. The RTA process was performed at 1220° C. for 30 seconds (in the nitrogen gas atmosphere) on a 6-inch p-type of wafer cut from the above ingot, on which an oxygen donor elimination heat treatment was performed at 650° C. for 30 minutes so as to have resistivity of about 300 to 900 Ωcm, an oxygen concentration (ASTM F-121, 1979) of about $14\times 10^{17}$ atoms/cm$^3$ and a carbon concentration of $0.8\times 10^{16}$ atoms/cm$^3$.

After the heat treatment, a remaining oxygen concentration, an oxygen precipitate density, a DZ layer thickness and resistivity were measured similar to the working examples 6 and 7. Each measurement was performed at the center part and the peripheral part of 20 mm from the periphery. The center of the wafer is in the oxygen precipitation accelerating region and the peripheral part of 20 mm from the periphery is in the oxygen precipitation suppressing region. Its measured result is shown in Table 14. The oxygen precipitate is uniformly formed on the wafer surface and also the resistivity is uniform on the wafer surface.

treatment was confirmed by X-ray topography, generation of the slip dislocation was as small as about 0.5 mm in length at a part corresponding to a position in which the wafer was supported by a supporting member at the time of the oxygen outward diffusion heat treatment. Thus, it is understood that the carbon doping is effective in improving the mechanical strength even in the wafer free from the COP in which the density of grown-in defect is $1\times 10^3$/cm$^3$ or less.

INDUSTRIAL APPLICABILITY

As described above, according to the high-resistance silicon wafer of the present invention, since oxygen precipitate (BMD) having a size of 0.2 μm is formed in the wafer so as to have a density of $1\times 10^4$/cm or more, the gettering ability is excellent. Since the general-purpose high-oxygen silicon wafer is used as the primary substrate, its manufacturing cost can be lowered. Since the oxygen concentration in the wafer is limited to $12\times 10^{17}$ atoms/cm$^3$ (ASTM F-121, 1979) or less, the thermal donor can be prevented from being generated in the heat treatment for forming the circuit, which is performed by the device maker.

In addition, lowering of the wafer strength caused by a large amount of oxygen precipitate (BMD) can be prevented by controlling the carbon concentration in the wafer to be $0.5\times 10^{16}$ atoms/cm$^3$ or more. Since the formation of the oxygen precipitate (BMD) can be promoted, a lower limit of the oxygen concentration in the primary substrate can be lowered to $12\times 10^{17}$ atoms/cm$^3$ (ASTM F-121, 1979).

TABLE 14

| Initial oxygen concentration ($\times 10^{17}$ atoms/cm$^3$) | Remaining oxygen concentration ($\times 10^{17}$ atoms/cm$^3$) | BMD density (/cm$^2$) | DZ width (μm) | Processing time for forming oxygen precipitate nucleus | Initial resistivity (Ω·cm) | Resistivity after TD formed (Ω·cm) |
|---|---|---|---|---|---|---|
| 14.0 | 5.0 | 9.1e6 | 9 | 5 hours | 586 | 685 |
|      | 5.2 | 9.4e6 | 8 |         | 592 | 712 |

In addition, since the crystal free from the COP in which the density of the grown-in defect detected by the seco etching is $1\times10^3$ cm$^{-3}$ or less is used, the resistivity variation caused by argon annealing or hydrogen annealing for making the crystal to be free from the COP can be avoided.

According to a manufacturing method of a high-resistance silicon wafer of the present invention, since the high-oxygen and high-resistance silicon wafer in which the oxygen concentration is $14\times10^{17}$ atoms/cm$^3$ (ASTM F-121, 1979) or more is used as the primary substrate, its manufacturing cost can be lowered. In addition to the fact that the initial oxygen concentration is high, since the remaining oxygen concentration after the heat treatment is as low as $12\times10^{17}$ atoms/cm$^3$ (ASTM F-121, 1979) or less, and two-stage heat treatments of the heat treatment for forming the oxygen precipitate nucleus and the heat treatment for forming the oxygen precipitate are implemented, a large-sized oxygen precipitate (BMD) can be formed at high density. More specifically, the oxygen precipitate (BMD) having a size of 0.2 μm or more can be formed so as to have high density of $1\times10^4$/cm$^2$ or more. Thus, the high-resistance having excellent gettering ability can be manufactured. Since the remaining oxygen concentration is limited to $12\times10^{17}$ atoms/cm$^3$ (ASTM F-121, 1979) or less, the oxygen thermal donor can be prevented from being generated in the heat treatment for forming the circuit, performed by the device maker.

In addition, the lowering of the wafer strength caused by the large amount of oxygen precipitates (BMD) can be prevented by controlling the carbon concentration in the wafer to be $0.5\times10^{16}$ atoms/cm$^3$ or more. Since the formation of the oxygen precipitate (BMD) can be promoted, the lower limit of the oxygen concentration in the primary substrate can be lowered to $12\times10^{17}$ atoms/cm$^3$ (ASTM F-121, 1979).

In addition, since the crystal free from the COP in which the density of the grown-in defect detected by the seco etching is $1\times10^3$ cm$^{-3}$ or less is used, the resistivity variation caused by the argon annealing or hydrogen annealing for making the crystal to be free from the COP can be avoided.

The invention claimed is:

1. A high-resistance silicon wafer having resistivity of 100 Ωcm or more, wherein an oxygen precipitate having a size of 0.2 μm or more is formed so as to have density of $1\times10^4$/cm$^2$ in the wafer, an oxygen concentration in the wafer as measured in accordance with ASTM F-121, 1979 is $12\times10^{17}$ atoms/cm$^3$ or less, and a carbon concentration is in a range of $0.5\times10^{16}$ atoms/cm$^3$ to $1.0\times10^{17}$ atoms/cm$^3$.

2. The high-resistance silicon wafer according to claim 1, wherein a density of a light point defect having a size of 0.12 μm or more and observed on a surface of the wafer is 0.2/cm$^2$ or less.

3. A high-resistance silicon wafer having resistivity of 100 Ωcm or more, wherein a density of a grown-in defect detected by seco etching is $1\times10^3$/cm$^{-3}$ or less, an oxygen precipitate having a size of 0.2 μm or more is formed so as to have density of $1\times10^4$/cm$^2$ or more in the wafer, an oxygen concentration in the wafer as measured in accordance with ASTM F-121, 1979 is $12\times10^{17}$ atoms/cm$^3$ or less, and a carbon concentration in the wafer is in a range of $0.5\times10^{16}$ atoms/cm$^3$ to $1.0\times10^{17}$ atoms/cm$^3$.

4. The high-resistance silicon wafer according to claim 1 or 3, wherein a denuded zone layer is formed at least 5 μm or more in depth from a surface of the wafer.

5. The high-resistance silicon wafer according to claim 1 or 3, wherein the oxygen concentration of the wafer as measured in accordance with ASTM F-121, 1979 is limited in ranges of $12\times10^{17}$ atoms/cm$^3$ or less, $7\times10^{17}$ atoms/cm$^3$ or less, and $5.8\times10^{17}$ atoms/cm$^3$ or less when the resistivity of the wafer is not less than 100 Ωcm and less than 300 Ωcm, not less than 300 Ωcm and less than 2000 Ωcm, and not less than 2000 Ωcm, respectively.

6. A method of manufacturing a high-resistance silicon wafer, comprising:

providing a primary silicon wafer in which resistivity is 100 Ωcm or more, oxygen concentration as measured in accordance with ASTM F-121, 1979 is $12\times10^{17}$ atoms/cm$^3$ or more, and a carbon concentration in a range of $0.5\times10^{16}$ atoms/cm$^3$ to $1.0\times10^{17}$ atoms/cm$^3$ is used, and producing the high-resistance silicon wafer in which a remaining oxygen concentration in the wafer is controlled to be $12\times10^{17}$ atoms/cm$^3$ as measured in accordance with ASTM F-121, 1979 or less by performing a heat treatment for forming an oxygen precipitate nucleus and a heat treatment for growing the oxygen precipitate on the primary silicon wafer.

7. A method of manufacturing a high-resistance silicon wafer, comprising:

providing a primary silicon wafer in which resistivity is 100 Ωcm or more, an oxygen concentration as measured in accordance with ASTM F-121, 1979 is $14\times10^{17}$ atoms/cm$^3$ or more, a carbon concentration in the wafer is controlled to be in a range of $0.5\times10^{16}$ atoms/cm$^3$ to $1.0\times10^{17}$ atoms/cm$^3$, and a density of a grown-in defect detected by seco etching is $1\times10^3$/cm$^{-3}$ is used, a remaining oxygen concentration in the wafer as measured in accordance with ASTM F-121, 1979 is controlled to be $12\times10^{17}$ atoms/cm$^3$ or less by performing a heat treatment for forming an oxygen precipitate nucleus and a heat treatment for growing the oxygen precipitate on the primary silicon wafer.

8. The method according to claim 6 or 7, wherein the heat treatment for forming the oxygen precipitate nucleus is a low-temperature heat treatment performed at 500 to 900° C. for 5 hours or more.

9. The method according to claim 8, wherein the conditions of the low-temperature heat treatment is at 700 to 900° C. for 5 hours or more.

10. The method according to claim 6 or 7, wherein the heat treatment for growing the oxygen precipitate is a high-temperature heat treatment performed at 950 to 1050° C. for 10 hours or more.

11. The method according to claim 6 or 7, further comprising performing an oxygen outward diffusion heat treatment is performed on the wafer at 1100 to 1250° C. for 1 to 5 hours before the heat treatment for forming the oxygen precipitate nucleus.

12. The method according to claim 11, further comprising performing the oxygen outward diffusion heat treatment in a gas atmosphere containing nitrogen gas.

13. The method according to claim 11, wherein the oxygen outward diffusion heat treatment is performed in an atmosphere of a hydrogen gas, argon gas or mixed gas thereof.

14. The method according to claim 6 or 7, further comprising performing a rapid thermal annealing process on the wafer before the heat treatment for forming the oxygen precipitate nucleus.

15. The method according to claim 14, wherein the rapid thermal annealing process is carried out at 1150 to 1300° C. for 1 to 60 seconds in an atmosphere containing nitrogen.

* * * * *